US010680616B2

(12) United States Patent
Tate et al.

(10) Patent No.: US 10,680,616 B2
(45) Date of Patent: Jun. 9, 2020

(54) BLOCK MEMORY LAYOUT AND ARCHITECTURE FOR PROGRAMMABLE LOGIC IC, AND METHOD OF OPERATING SAME

(71) Applicant: Flex Logix Technologies, Inc., Mountain View, CA (US)

(72) Inventors: Geoffrey R. Tate, Portola Valley, CA (US); Cheng C. Wang, San Jose, CA (US)

(73) Assignee: Flex Logix Technologies, Inc., Mountain View, CA (US)

( * ) Notice: Subject to any disclaimer, the term of this patent is extended or adjusted under 35 U.S.C. 154(b) by 0 days.

(21) Appl. No.: 15/978,235

(22) Filed: May 14, 2018

(65) Prior Publication Data

US 2018/0262198 A1    Sep. 13, 2018

Related U.S. Application Data

(62) Division of application No. 15/239,958, filed on Aug. 18, 2016, now Pat. No. 9,973,194.

(Continued)

(51) Int. Cl.
*H03K 19/177* (2020.01)
*H03K 19/1776* (2020.01)
(Continued)

(52) U.S. Cl.
CPC ..... *H03K 19/1776* (2013.01); *H03K 19/1737* (2013.01); *H03K 19/17728* (2013.01);
(Continued)

(58) Field of Classification Search
None
See application file for complete search history.

(56) References Cited

U.S. PATENT DOCUMENTS 5,682,107 A    10/1997  Tavana
5,933,023 A     8/1999  Young
(Continued)

FOREIGN PATENT DOCUMENTS

EP       1 005 163 A2    5/2000

OTHER PUBLICATIONS

International Search Report and Written Opinion of International Searching Authority re: PCT/US2016/047465, dated Aug. 18, 2016, 17 pages.

(Continued)

*Primary Examiner* — Seokjin Kim
(74) *Attorney, Agent, or Firm* — Neil A. Steinberg

(57) ABSTRACT

An integrated circuit comprising a first memory array and programmable/configurable logic circuitry including a plurality of logic tiles wherein each logic tile includes a perimeter, a plurality of external I/O disposed in an I/O layout on the perimeter, wherein the I/O layout of each tile is identical. Each external I/O is configurable as an external I/O to connect to and communicate with external circuitry, or a memory I/O to point-to-point connect to memory located adjacent thereto, or an unused I/O. The first memory array is physically adjacent to a first logic tile on a first portion of the perimeter of the first logic tile which is interior to the periphery of the programmable/configurable logic circuitry, and point-to-point connected to the memory I/O. In operation, circuitry of the first logic tile is configured to read data from and write data to the first memory array via the memory I/O.

17 Claims, 40 Drawing Sheets

Related U.S. Application Data

(60) Provisional application No. 62/213,080, filed on Sep. 1, 2015.

(51) Int. Cl.
*H03K 19/17736* (2020.01)
*H03K 19/17728* (2020.01)
*H03K 19/173* (2006.01)
*G11C 5/02* (2006.01)

(52) U.S. Cl.
CPC . *H03K 19/17736* (2013.01); *H03K 19/17744* (2013.01); *G11C 5/025* (2013.01)

(56) References Cited

U.S. PATENT DOCUMENTS

| | | | |
|---|---|---|---|
| 6,075,380 A * | 6/2000 | Lane | G06F 1/03 326/39 |
| 6,094,066 A | 7/2000 | Mavis | |
| 6,211,695 B1 | 4/2001 | Agrawal | |
| 6,671,865 B1 | 12/2003 | Ali et al. | |
| 7,073,099 B1 * | 7/2006 | Sutardja | G06F 11/1008 714/710 |
| 7,495,970 B1 * | 2/2009 | Tang | G11C 29/028 326/39 |
| 7,755,387 B2 * | 7/2010 | Minz | H03K 19/17736 326/41 |
| 9,973,194 B2 | 5/2018 | Tate et al. | |
| 2002/0196809 A1 * | 12/2002 | Agrawal | H03K 19/1737 370/469 |
| 2004/0010767 A1 | 1/2004 | Agrawal et al. | |
| 2011/0121366 A1 | 5/2011 | Or-Bach et al. | |
| 2012/0012895 A1 | 1/2012 | Or-Bach et al. | |
| 2012/0286822 A1 | 11/2012 | Madurawe | |
| 2016/0372182 A1 * | 12/2016 | Liaw | H01L 27/1116 |

OTHER PUBLICATIONS

Rabaey et al., "Digital Integrated Circuits; A Design Perspective", 2nd Edition, Prentice Hall, 2003, pp. 414-415.
EPO Supplementary Search Report, dated Apr. 10, 2019, 9 pages.

* cited by examiner

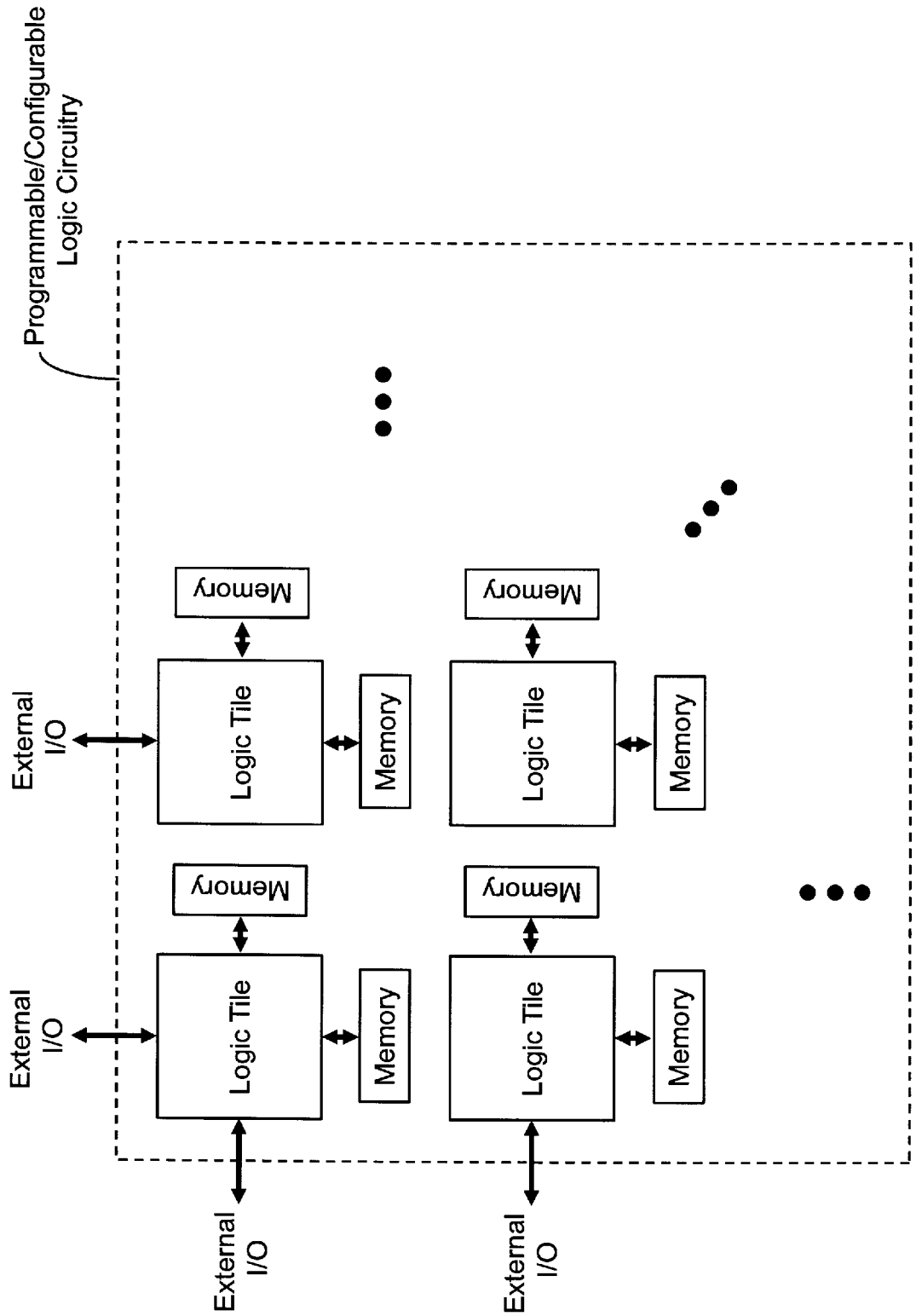

BLOCK MEMORY LAYOUT AND ARCHITECTURE FOR PROGRAMMABLE LOGIC IC, AND METHOD OF OPERATING SAME

RELATED APPLICATIONS

This application is a divisional of U.S. Non-Provisional application Ser. No. 15/239,958, filed Aug. 16, 2016 (now U.S. Pat. No. 9,973,194). This application and the '958 application claim priority to and the benefit of U.S. Provisional App. No. 62/213,080, filed Sep. 1, 2015, which is incorporated herein by reference in its entirety.

INTRODUCTION

In one aspect, the present inventions are directed to an integrated circuit, and layout/architecture thereof, including programmable or configurable logic circuitry having a plurality of logic tiles and block memory (for example, a block or an array of dynamic and/or static random access memory cells such as DRAM, SRAM, Flash, EPROM, EEPROM and/or MRAM; notably, all memory types, and combinations thereof, are intended to call within the scope of the present inventions). In one embodiment, one or more arrays of block memory is/are disposed between consecutive logic tiles and/or adjacent to one or more logic tiles of the array of logic tiles of the programmable/configurable logic circuitry of an integrated circuit. Notably, the integrated circuit may be, and layout/architecture thereof may be implemented in, for example, a processor, controller, state machine, gate array, programmable gate array (PGA), field programmable gate array (FPGA), and system-on-chip (SOC). For example, in one embodiment, the logic tiles and block memory layout/architecture of the present inventions (wherein one or more arrays of block memory is/are disposed between consecutive logic tiles and/or located adjacent to one or more of the array of logic tiles) is employed in programmable or configurable logic circuitry of a processor, controller, state machine, gate array, PGA, FPGA and SOC.

Briefly, an FPGA is an integrated circuit which may be configured and/or reconfigured (hereinafter, unless stated otherwise, collectively "configured" or the like (e.g., "configure", "configuring" and "configurable")) by a user, customer and/or a designer before and/or after manufacture. The FPGA includes, among other things, a plurality of tiles having programmable logic components (often called "configurable logic blocks" (CLB), "logic array blocks" (LABs), or "logic tiles"—herein collectively "logic tiles") and a network of configurable interconnects that facilitate communication between the plurality of logic tiles. (See, FIG. 1A).

Each logic tile typically includes thousands of transistors organized generally into logic and I/O—for example, a plurality of (i) logic blocks to perform combinational and/or sequential functions, each logic block including one or more multiplexers or switches which may be arranged in a plurality of switch matrix or switch matrices stages of an interconnect network, to, for example, perform logic operations in or during normal operation of the integrated circuit (based on that current configuration of the logic block(s)) and (ii) I/O (I/O pins and associated I/O circuitry or blocks)—for example, I/O pins, disposed on the periphery, perimeter or edge of the logic tile, and I/O circuitry or blocks associated with such I/O pins, to facilitate interconnection between circuitry of the logic tile and circuitry external to the programmable/configurable logic circuitry. (See, FIGS. 1B and 1C). The transistors of each logic block of the logic tile may be configured to perform combinational and/or sequential functions (simple and/or complex). Notably, the I/O (I/O pins and associated I/O circuitry/blocks) are commonly interspersed along the entire perimeter or border of the logic tile—for example, in those situations where the logic tile has a square or rectangle shape, on all four sides. (See, for example, FIG. 1C). Notably, an I/O pin is a physical point of entry/exit of the signal to the logic tile; all physical forms of entry/exit of the signal to the logic tile are intended to fall within the scope of the present invention (for example, a conductor or metal routing in/of an integrated circuit).

BRIEF DESCRIPTION OF THE DRAWINGS

The present inventions may be implemented in connection with embodiments illustrated in the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment(s) is/are "example" embodiment(s).

FIGS. 3A-3H illustrate exemplary block diagram representations of exemplary programmable/configurable logic circuitry which includes a plurality of logic tiles (wherein, in the illustrative embodiment, organized in an array) and a plurality of blocks or arrays of memory, according to certain aspects of the present inventions wherein, in one embodiment, one or more of the blocks or arrays of dynamic or static random access memory are electrically coupled to and operatively associated with one or more adjacent logic tiles; such memory may be any type now known or later developed including, for example, DRAM, SRAM, Flash, EPROM, EEPROM and/or MRAM; moreover, the exemplary programmable/configurable logic circuitry may implement one type of memory in the logic circuitry or implement any combination of different memory types, all combinations are intended to fall within the scope of the present inventions; notably, in one embodiment of the present inventions, the block or array of memory may be electrically coupled to the logic blocks of the logic tile associated with the memory via predetermined I/O (for example, I/O pins and I/O circuitry or blocks) of such logic tile (for example, I/O that are not employed to interconnect circuitry of the logic tile and circuitry external to the programmable/configurable logic circuitry—i.e., unused I/O of the logic tile); in one embodiment according to certain aspects of the present inventions, the predetermined I/O include those I/O of those logic tiles that are not located on the periphery or perimeter of the programmable/configurable logic circuitry;

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

DETAILED DESCRIPTION

In a first aspect, the present inventions are directed to an integrated circuit (for example, a processor, controller, state machine, gate array, PGA, FPGA and SOC), and layout/architecture thereof, including programmable or configurable logic circuitry having a plurality of logic tiles and one or more memory arrays or blocks disposed between and juxtaposed one or more logic tiles of the array of logic tiles. For example, in one embodiment, the memory arrays or blocks are static or non-volatile memory (for example, SRAM) which are located between consecutive logic tiles and/or located adjacent one or more logic tiles of a programmable or configurable logic circuitry of a processor, controller, state machine, gate array, PGA, FPGA and SOC. Notably, the memory may be SRAM, DRAM, Flash, EPROM, EEPROM and/or MRAM or other memory now known or later developed, all of which are intended to fall within the scope of the present inventions. Moreover, the programmable/configurable logic circuitry, and layout thereof, may include one type of memory (for example, SRAM, Flash or MRAM) disposed between adjacent logic tiles or a plurality of different types (for example, SRAM, Flash and MRAM); all combinations and/or permutations of different types of memories are intended to fall within the scope of the present inventions.

Figure 1A:
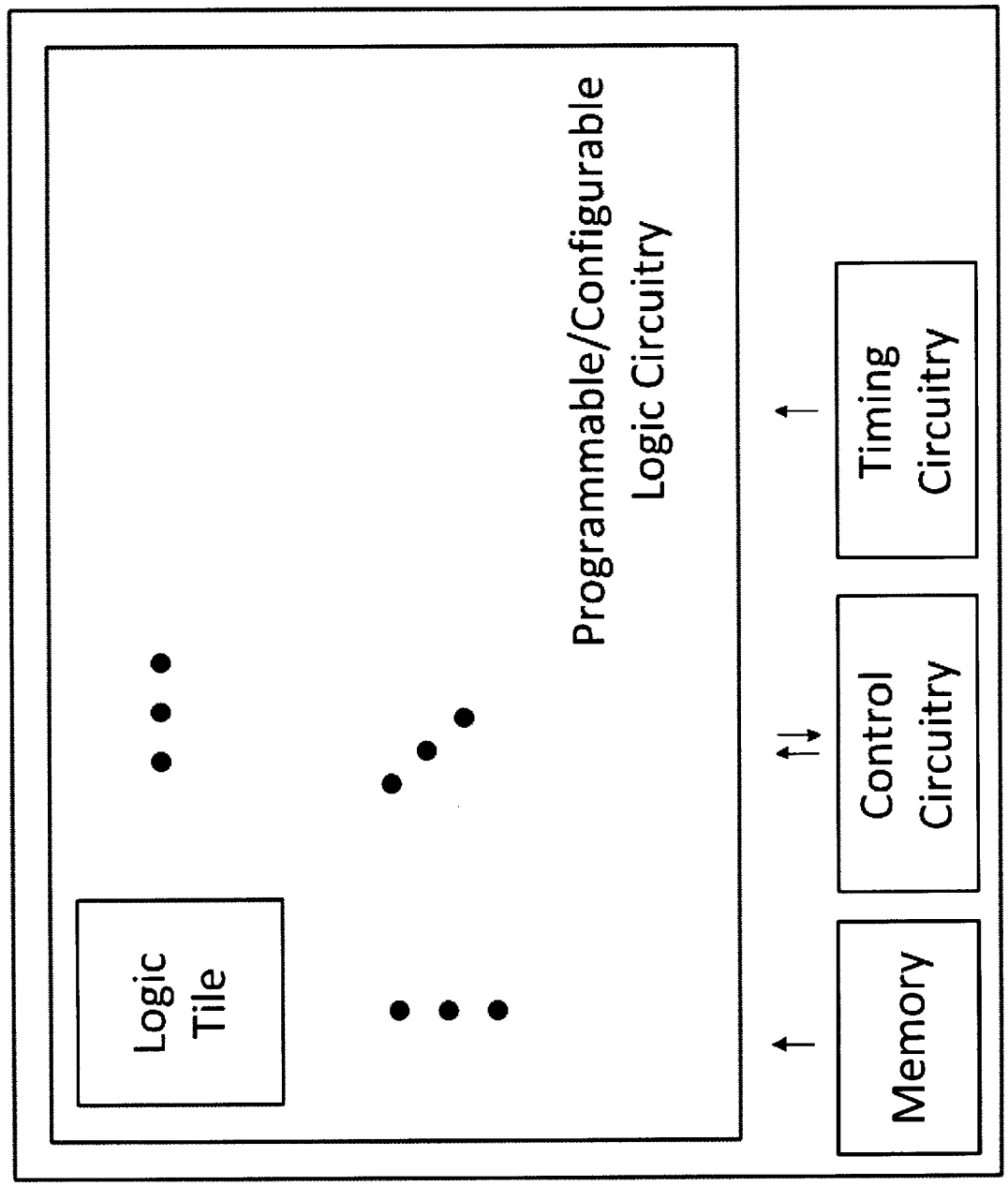
FIG. 1A illustrates a block diagram representation of an exemplary integrated circuit including control circuitry, clock circuitry, memory and programmable/configurable logic circuitry (which includes a plurality of logic tiles, each of which includes logic transistors (that may be interconnected, for example, as multiplexers or switches having two or more inputs which are electrically coupled to associated configuration cells that, when programmed, determine the operation of the multiplexers))
Figure 1B:
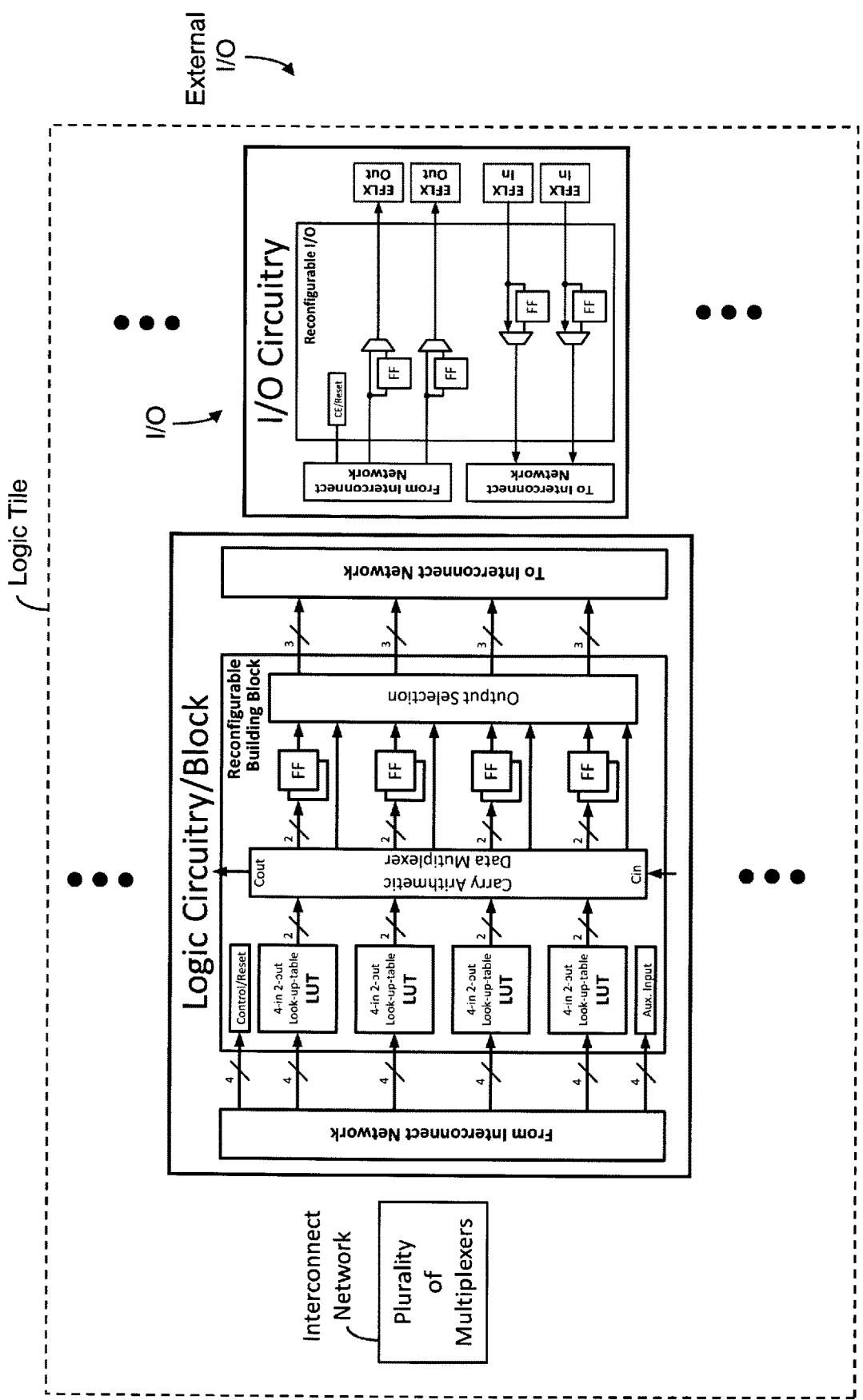
FIG. 1B illustrates a block diagram representation of an exemplary logic tile of the programmable/configurable logic circuitry of FIG. 1A, wherein the logic tile includes logic and I/O for example, a plurality of (i) logic blocks, each logic block including, for example, a plurality of look-up-tables, arithmetic blocks, data multiplexers, flip-flops, and control/reset circuitries, (ii) I/O (I/O and I/O circuitry or blocks, which are disposed on the periphery, perimeter or edge of the logic tile, to facilitate interconnection between circuitry of the logic tile and circuitry external to the programmable/configurable logic and (iii) an interconnect network composed of one or more multiplexers or switches which may be arranged or configured into an interconnect network having a plurality of switch matrix or switch matrices stages, to, for example, perform or facilitate performance of logic operation in or during normal operation of the currently configured integrated circuit; notably, the I/O (for example, I/O pins) are typically disposed along the entire perimeter, periphery or border of the logic tile (for example, where the logic tile has a square or rectangle shape, on all four sides); notably, I/O means one input/output (which may be uni-directional conductor and/or bi-directional conductor) and/or a plurality of inputs/outputs (i.e., more than one uni-directional conductor and/or more than one bi-directional conductor)
Figure 1C:
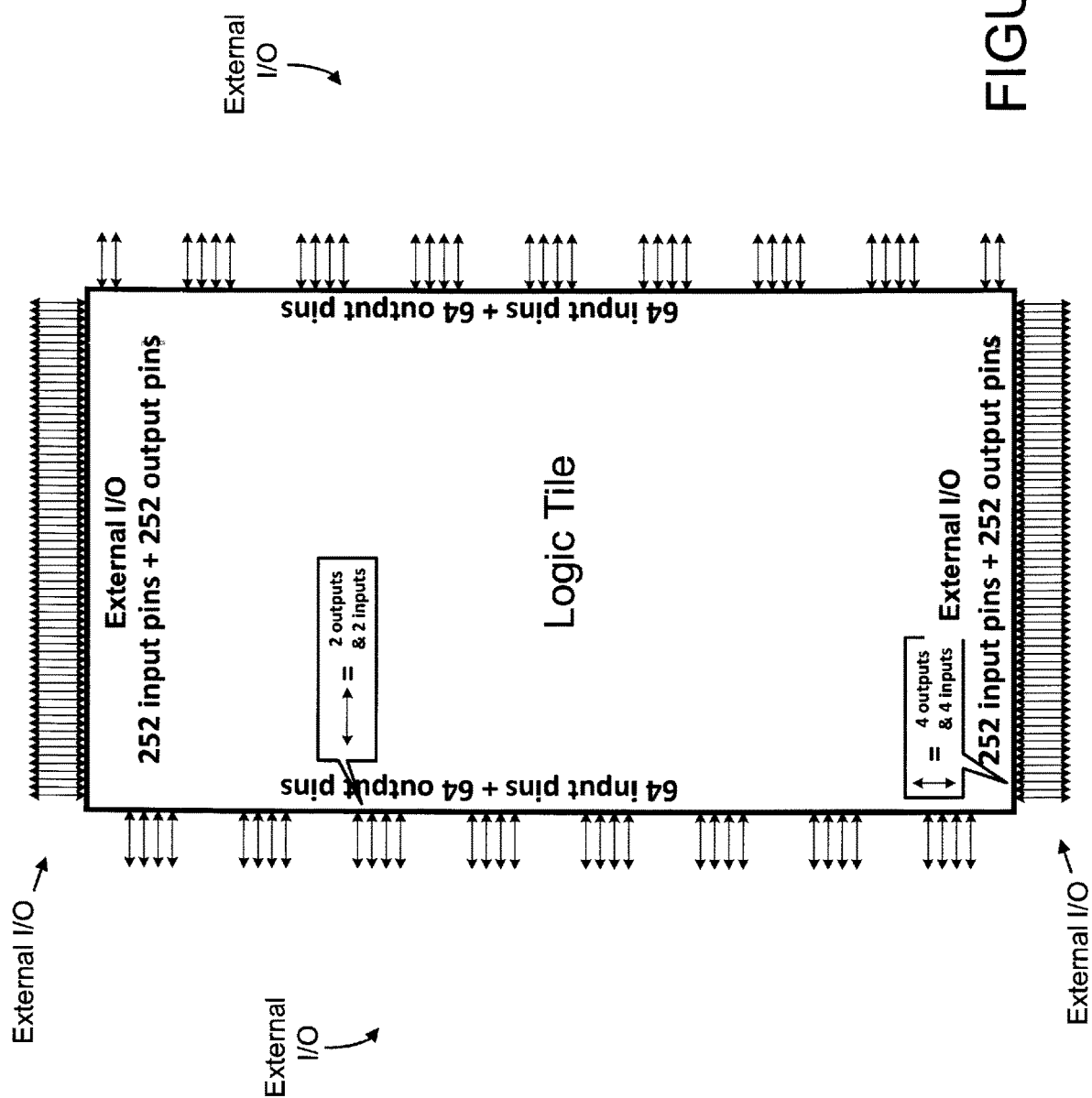
FIG. 1C illustrates a block diagram representation of an exemplary logic tile of the programmable/configurable logic circuitry of FIGS. 1A and 1B wherein external I/O of the logic tile (which are electrically coupled to I/O circuitry or blocks) are located on all sides of the logic tile (i.e., interspersed along the entire perimeter of the logic tile); notably, the external I/O are separate from or independent of the I/O of the logic tile used for internal interconnect of the network within the logic tile and/or between logic tiles of the programmable/configurable logic circuitry.
Figure 2A:
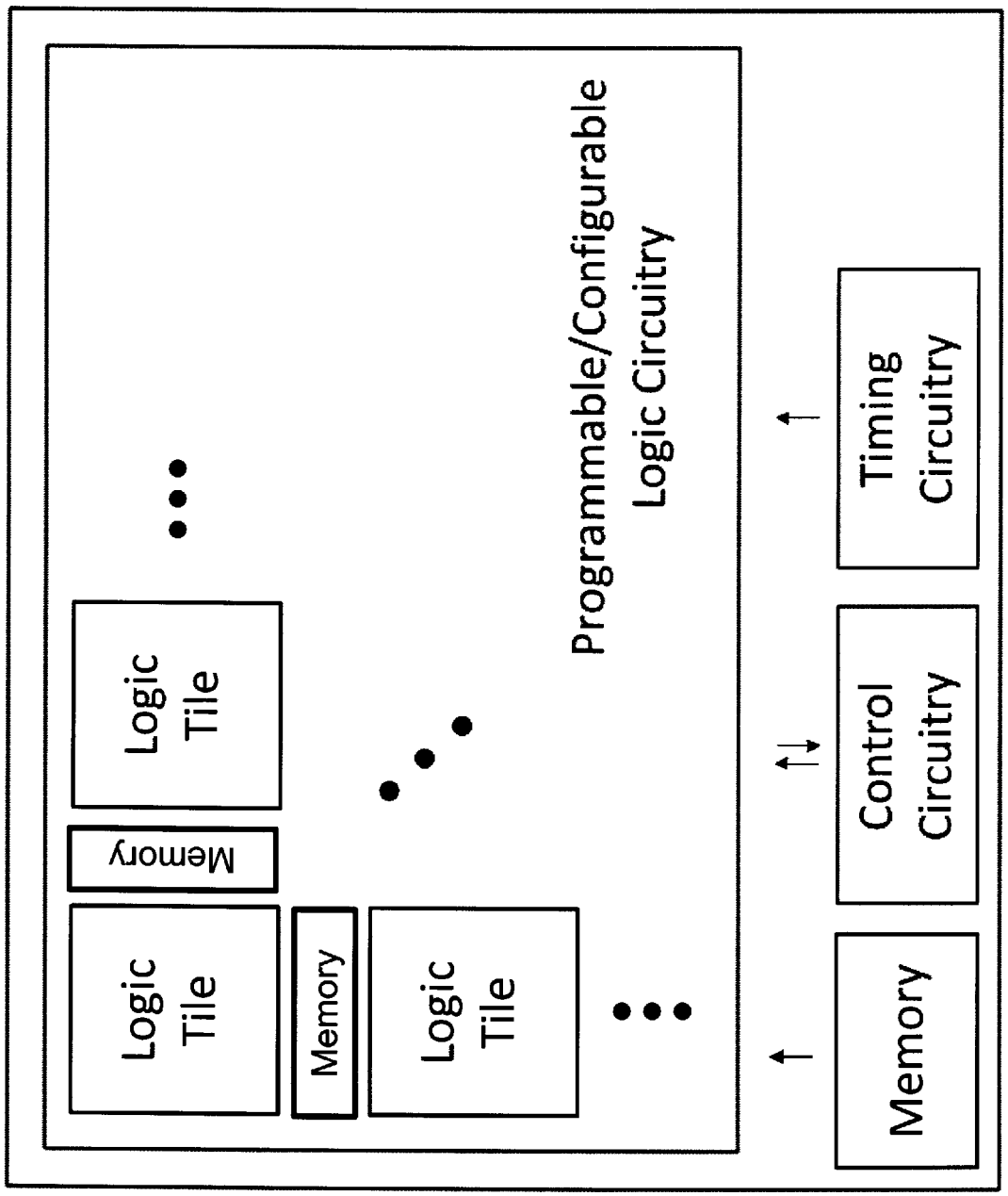
FIGS. 2A-2C illustrate exemplary block diagram representations of exemplary integrated circuit including control circuitry, clock circuitry, memory and programmable/configurable logic circuitry (which includes a plurality of logic tiles) according to certain aspects of the present inventions wherein the memory is disposed between consecutive logic tiles and/or located adjacent to interior borders or sides of logic tiles (which is in the interior of the programmable/configurable logic circuitry) according to aspects of the present inventions; notably, the memory may be a block or an array of dynamic or static random access memory such as DRAM, SRAM, Flash, EPROM, EEPROM and/or MRAM (all memory types are intended to call within the scope of the present inventions)

With reference to FIG. 2A, in one embodiment of an integrated circuit (and layout thereof) according to the present inventions, a memory array or block is located within the perimeter of programmable/configurable logic circuitry and between consecutive logic tiles and/or adjacent to logic tiles. The memory array or block may be suitably organized, designed or configured (for example, single-port or dual-port memory) to connect to either or both of the logic tiles that is/are juxtaposed thereto. Indeed, the illustrated memory array or block may consist of a plurality of arrays or blocks and, in one embodiment, a portion of which are connected to one of the adjacent logic tile and another portion are connected to the other adjacent logic tile. As noted above, the memory array or block may be SRAM, DRAM, Flash, EPROM, EEPROM and/or MRAM or any other memory now known or later developed. In addition, the same type of memory may be employed throughout programmable/configurable logic circuitry (for example, SRAM) or different types of memory may be employed (for example, SRAM, DRAM, Flash and/or MRAM). As mentioned above, all combinations and/or permutations of the different types of memories are intended to fall within the scope of the inventions.

Figure 2B:
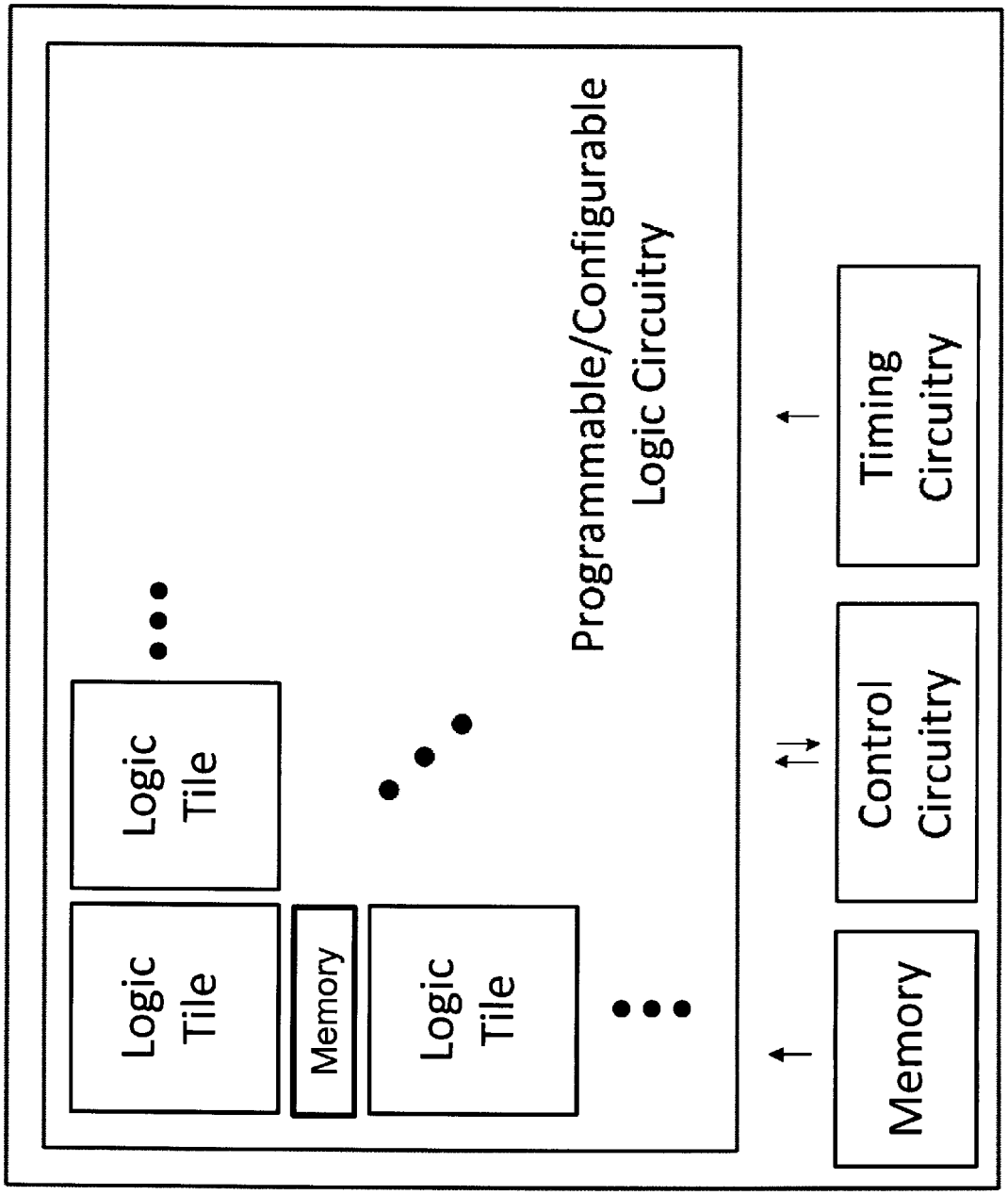
Figure 2C:
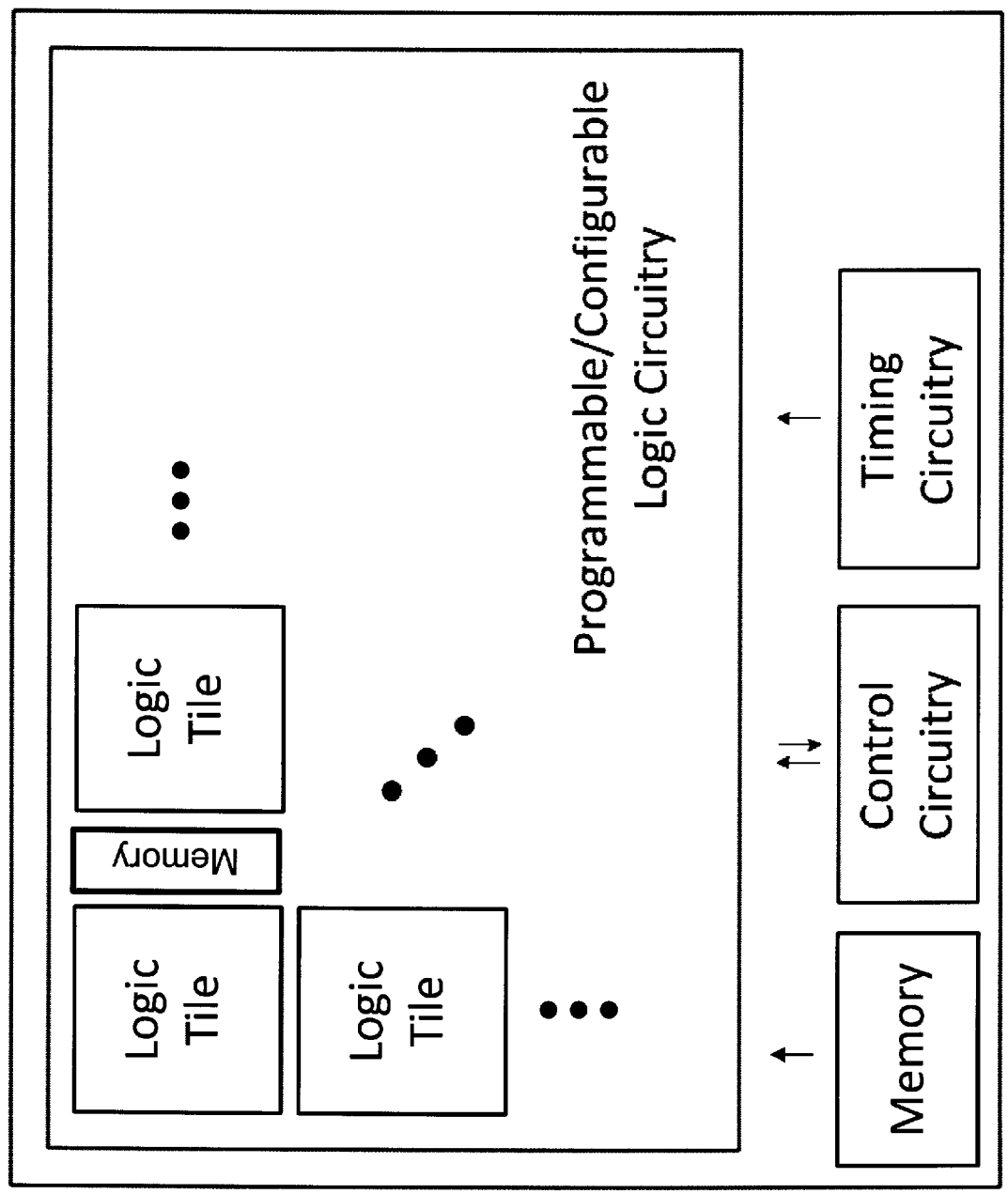

The memory may be disposed on one, some or all of the borders, edges or sides of the logic tiles that do not form a portion of the border or perimeter of the programmable/configurable logic circuitry. For example, with continued reference to FIG. 2A, the upper most left logic tile is juxtaposed or adjacent memory arrays or blocks on both sides that do not form a portion of the perimeter of the programmable/configurable logic circuitry. With reference to FIGS. 2C and 2B, however, the upper most left logic tile is juxtaposed to a memory array block on only one side or edge. As such, in this embodiment, the other side(s) of the logic tiles is/are juxtaposed to (and abut in those situations where a compact layout is intended) an adjacent logic tile. Notably, with continued reference to FIGS. 2C and 2B, the memory array or block may be interconnected and associated with both logic tiles juxtaposed thereto or only the upper most left logic tile (in which case, the other logic tile would be connected to and operatively associated with one or more memory array or blocks that is/are juxtaposed or adjacent the sides of the logic tile that are not a portion of the perimeter or border of the programmable/configurable logic circuitry. Again, the memory array or block may consist of one or more arrays or blocks that are suitably organized, designed or configured (for example, single-port or dual-port memory) to connect to the associated logic tile(s).

Figure 4:
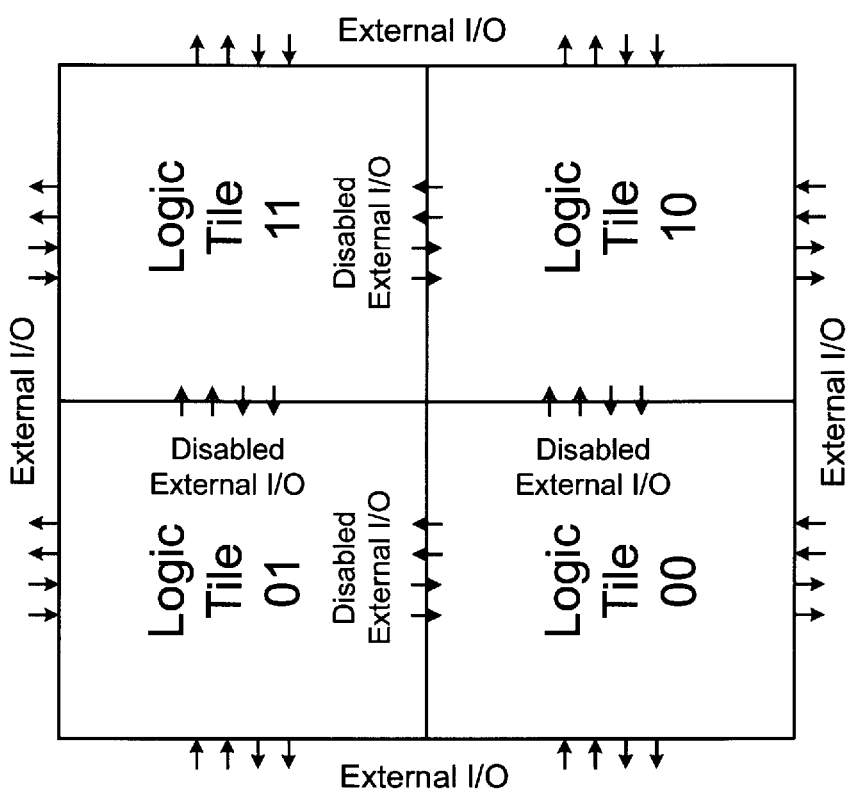
FIG. 4 illustrates an exemplary block diagram representation of exemplary programmable/configurable logic circuitry having four logic tiles wherein the external I/O of the logic tiles that are disposed internal to the periphery of the programmable/configurable logic circuitry (i.e., that are not disposed on the periphery of the programmable/configurable logic circuitry) are typically disabled for the purposes of interfacing as external I/O and, in one embodiment according to certain aspects of the present inventions, such I/O are employed as memory I/O to interface with memory which is disposed between consecutive logic tiles and/or located adjacent to one or more logic tiles.

In another aspect, the present inventions are directed to an integrated circuit having programmable/configurable logic circuitry, and layout thereof, having one or more memory arrays or blocks connected to a logic tile via I/O "pins" on such logic tile. Briefly, the logic tiles of the programmable/configurable logic circuitry include I/O "pins" that are located and interspersed along or on the perimeter (for example, the entire perimeter) of the tiles (for example, in those situations where the logic tile has a square or rectangle shape, I/O pins are located and interspersed on all four sides). Those I/O pins located on the perimeter of a logic tile that form a portion of the perimeter of the programmable/configurable logic circuitry are typically employed to interconnect with circuitry external to the programmable/configurable logic circuitry. The I/O pins disposed on those sides or borders that do not form a portion of the perimeter of the programmable/configurable logic circuitry are typically disabled. (See, for example, FIG. 4). That is, I/O pins disposed or located on a perimeter of the logic tiles that are internal to the perimeter of the programmable/configurable logic circuitry are typically disabled and not used to connect to circuitry external to the programmable/configurable logic circuitry. The tile-to-tile communication in the scope of this invention is typically performed using interconnect network (for example, a user-programmable/definable—see, for example, U.S. patent application Ser. No. 15/041,085, filed Feb. 11, 2016, which claims priority to U.S. Provisional Application No. 62/119,215, filed Feb. 22, 2015, entitled "Mixed-Radix and/or Mixed-Mode Switch Matrix Architecture and Integrated Circuit, and Method of Operating Same"; both of which are incorporated by reference; see also, U.S. patent application Ser. No. 14/777,477), and typically do not employ the I/O "pins" illustrated herein. For the sake of clarity, the tile-to-tile interconnection and communication are not illustrated and/or discussed in detail herein.

As such, in this aspect of the present inventions, a logic tile connects to one or more memory arrays or blocks (that is/are juxtaposed thereto) via I/O "pins" that are located on one or more perimeters, borders or sides of the logic tile that are internal to the perimeter of the programmable/configurable logic circuitry. In one embodiment of the present inventions, I/O pins on a perimeter of the logic tiles that are not located on a perimeter of the programmable/configurable logic circuitry are available for and may be employed to interconnect to one or more memory arrays or blocks juxtaposed to that perimeter of the logic tile. The memory may be employed by circuitry in the associated logic tile(s) (e.g., logic tile(s) that are located adjacent to and/or in communication with the memory) as general-purpose memories, such as, but is not limited to, a scratchpad memory, a first-in-first-out (FIFO) memory, and/or a data/instruction RAM.

Figure 3A:
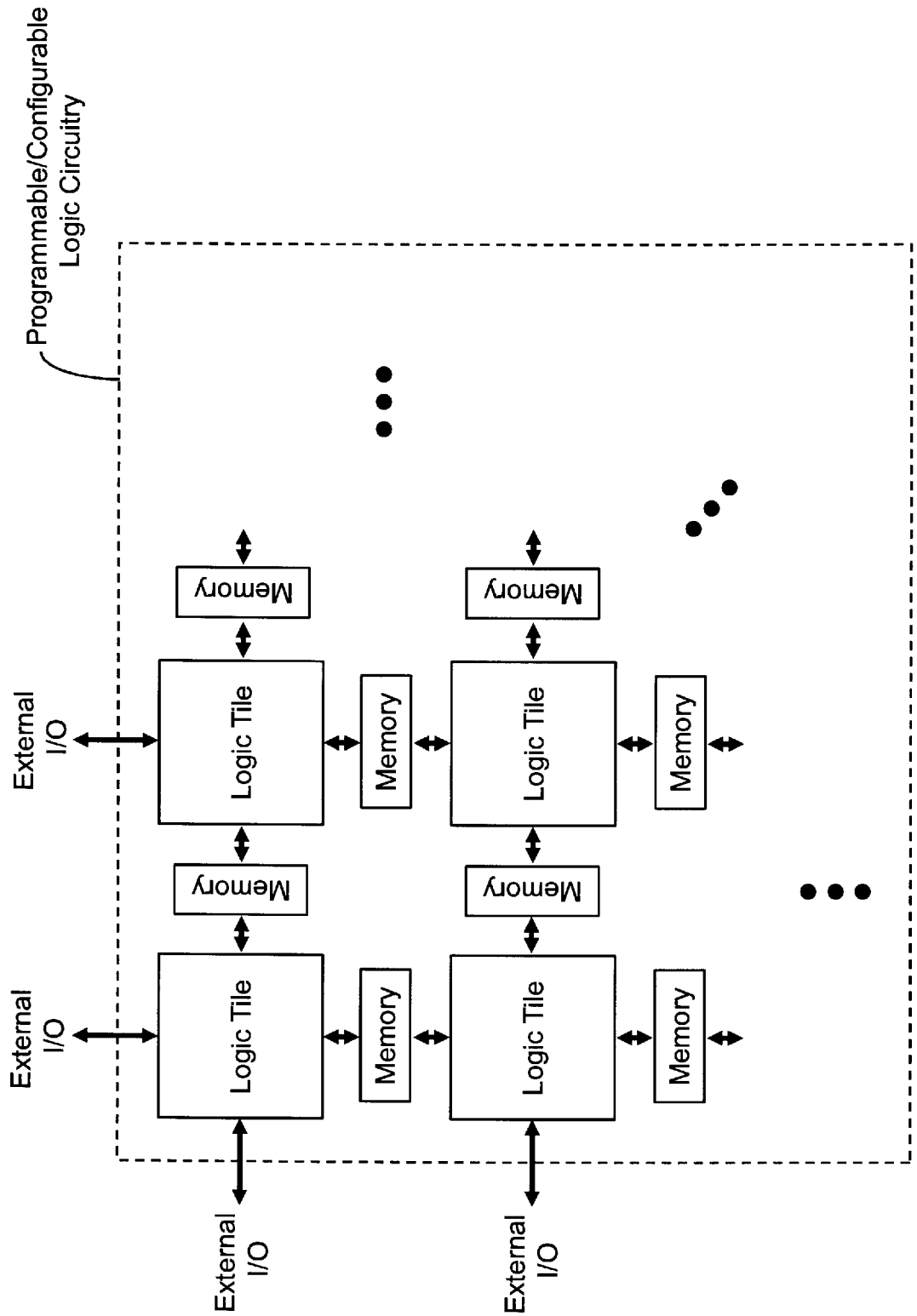
Figure 3B:
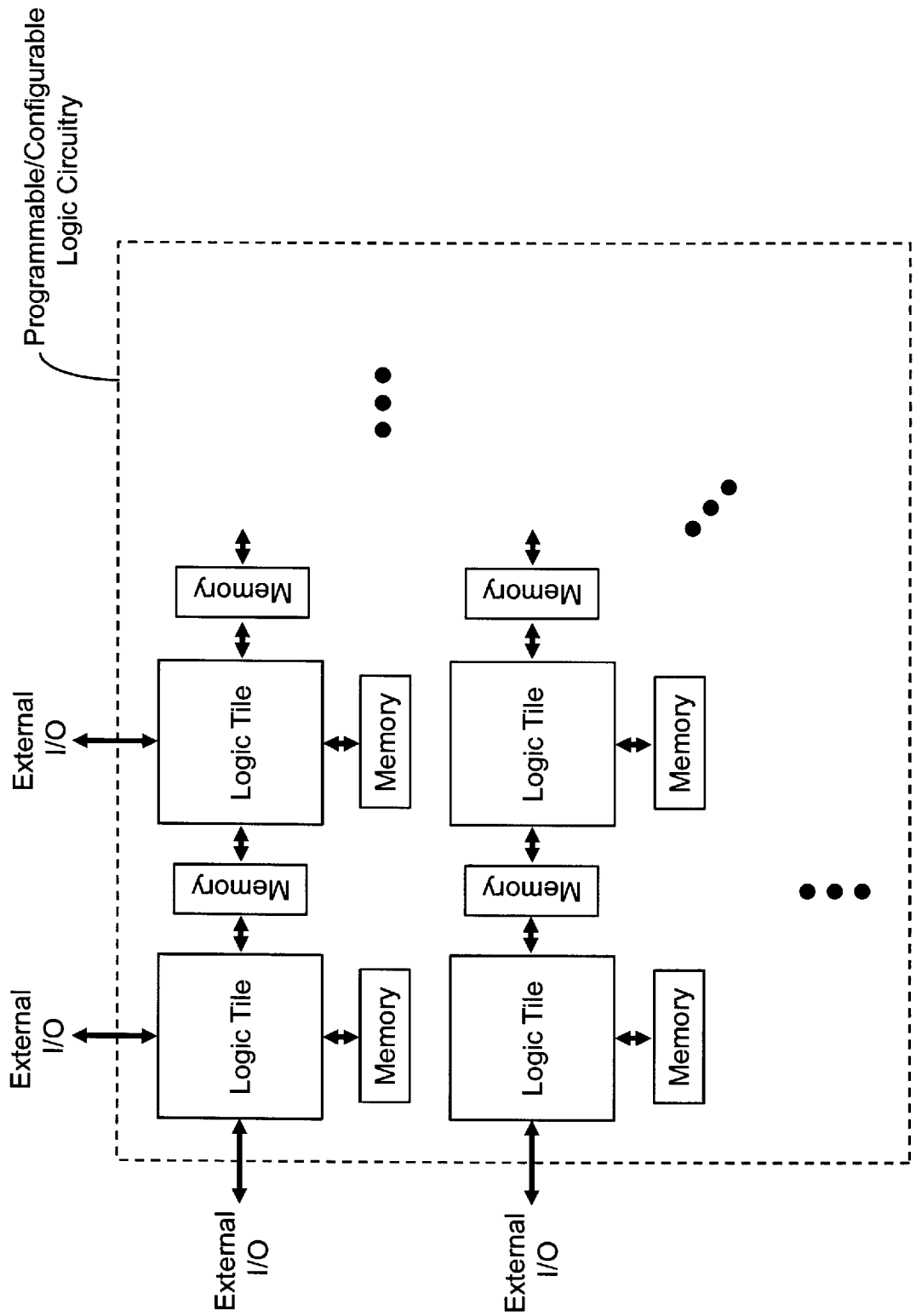
Figure 3D:
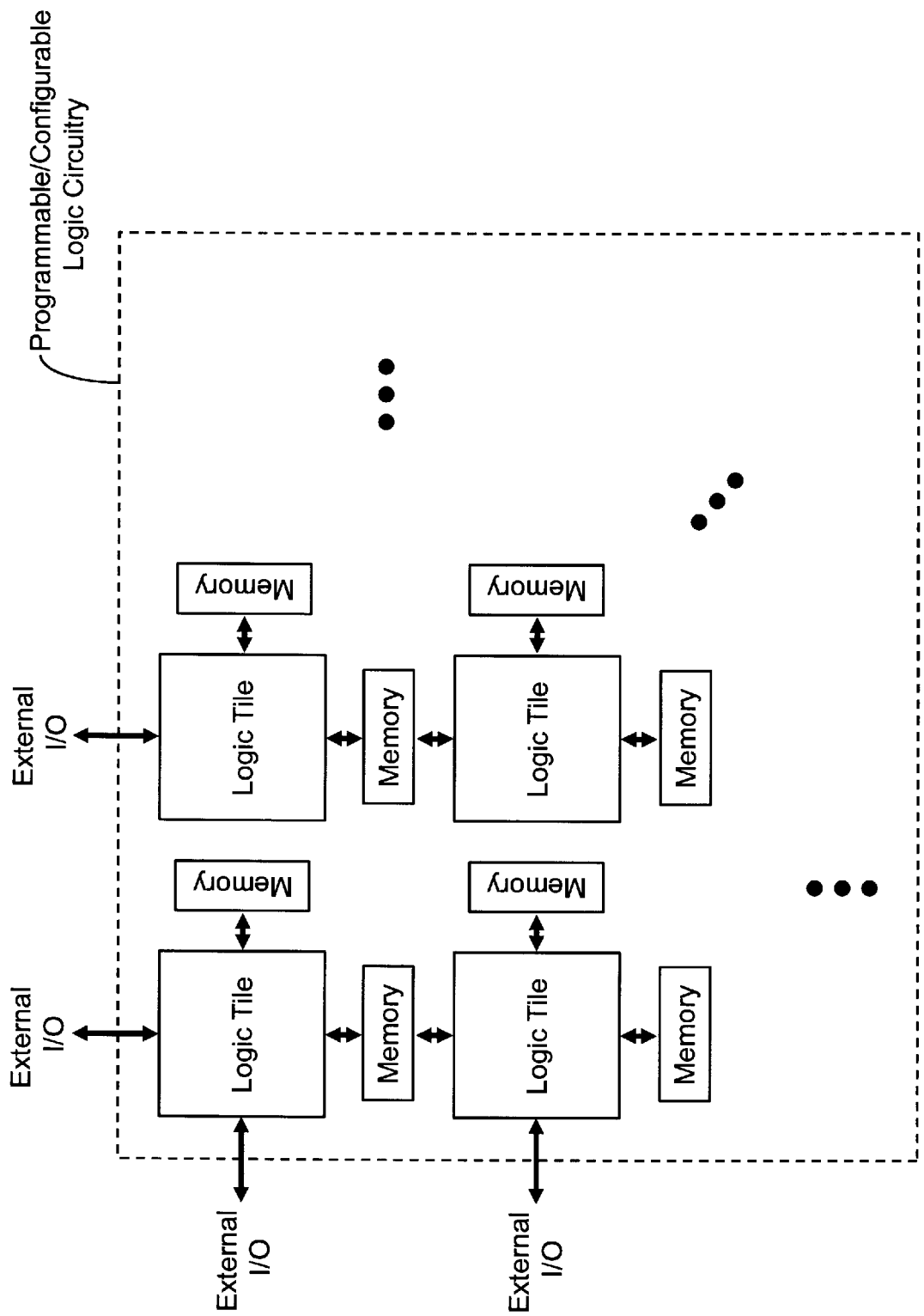
Figure 3E:
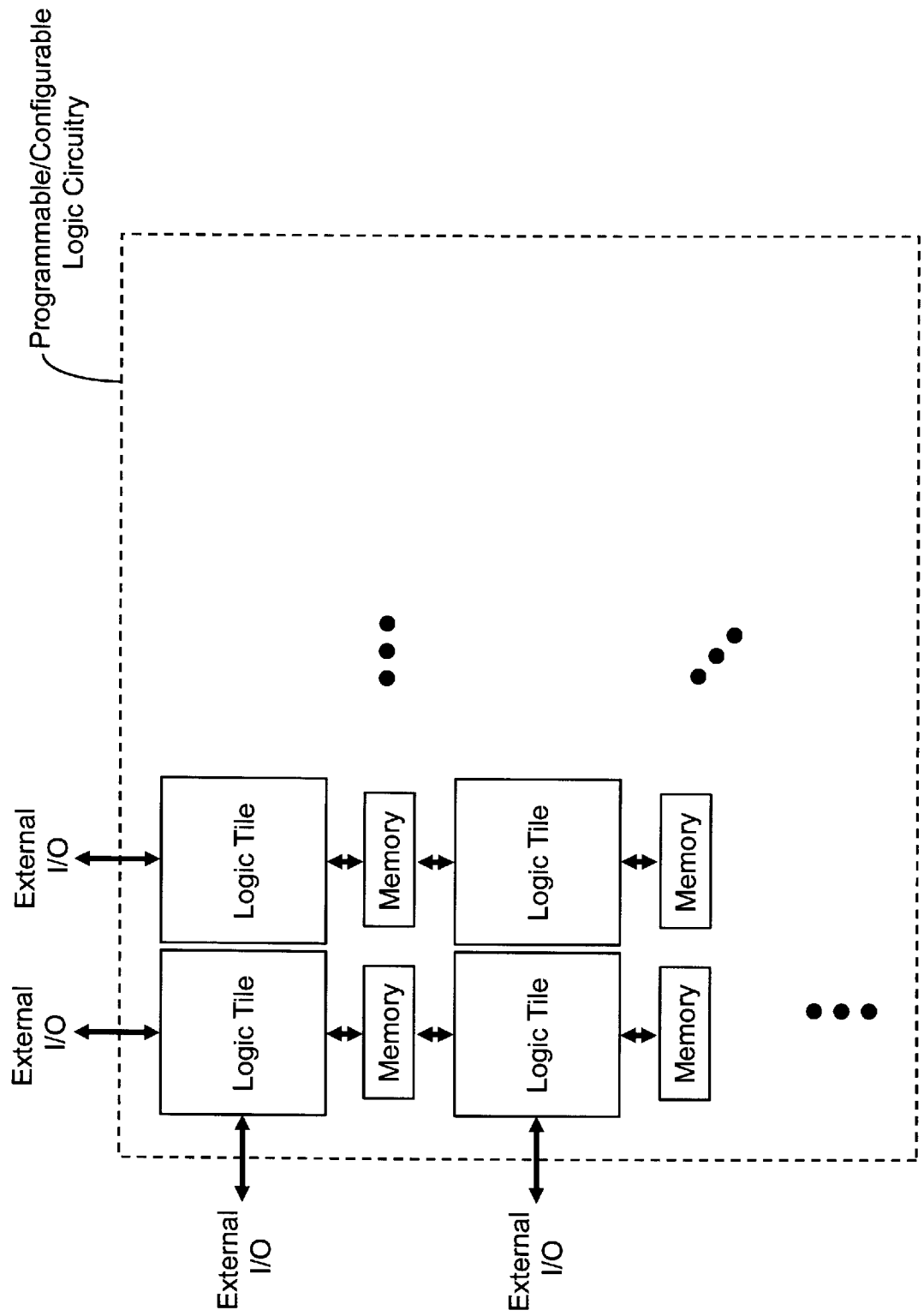
Figure 3F:
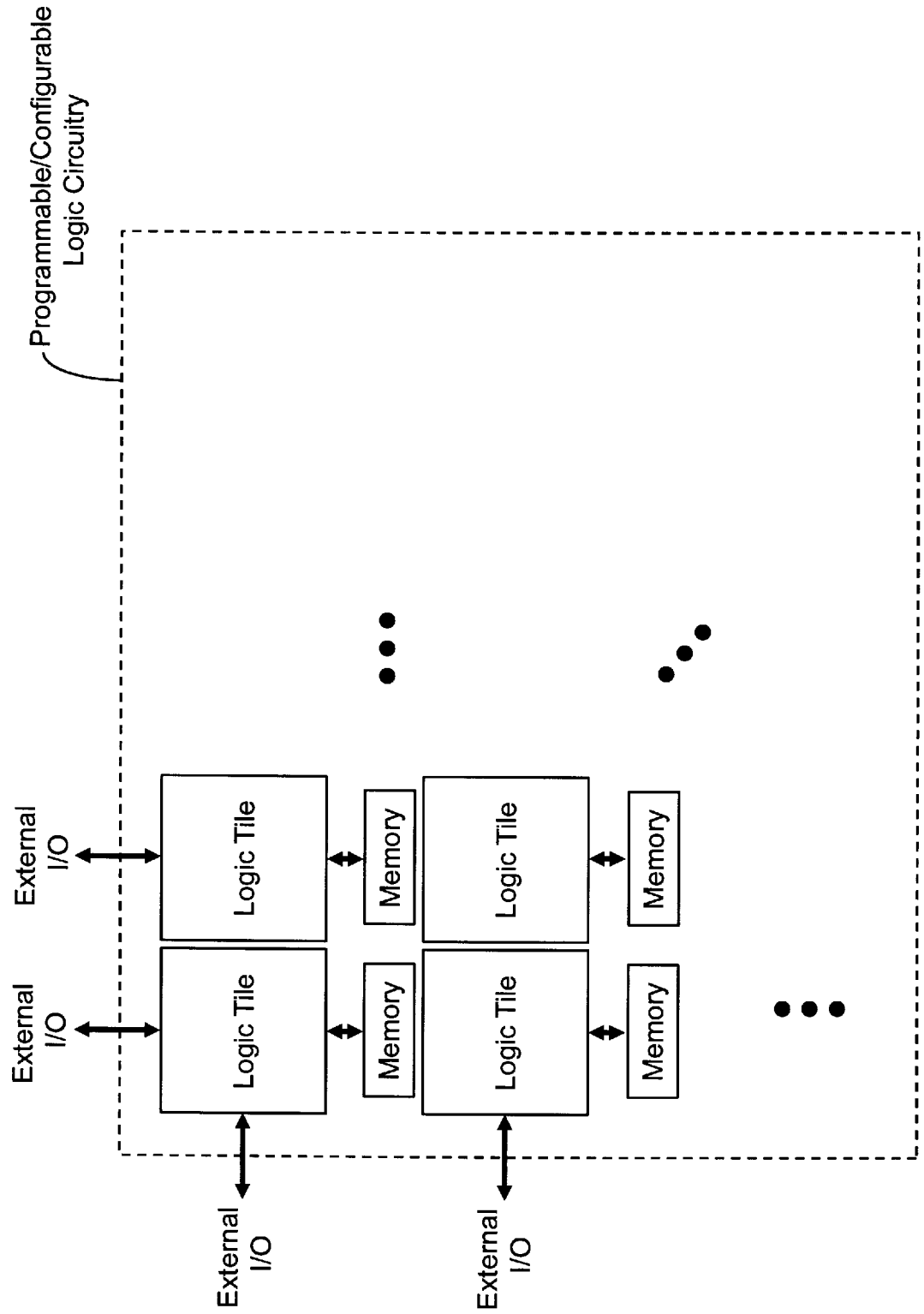
Figure 3G:
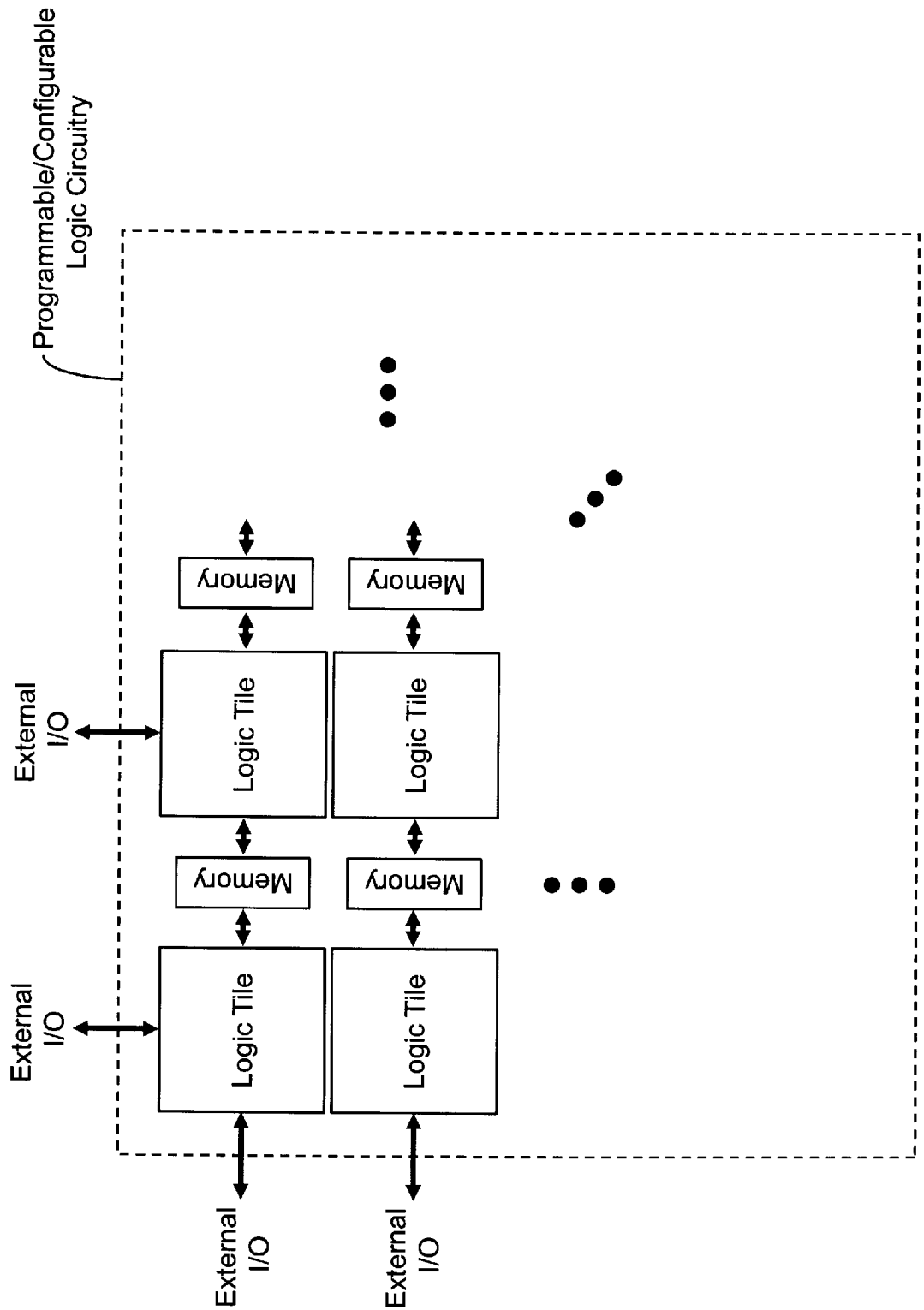
Figure 3H:
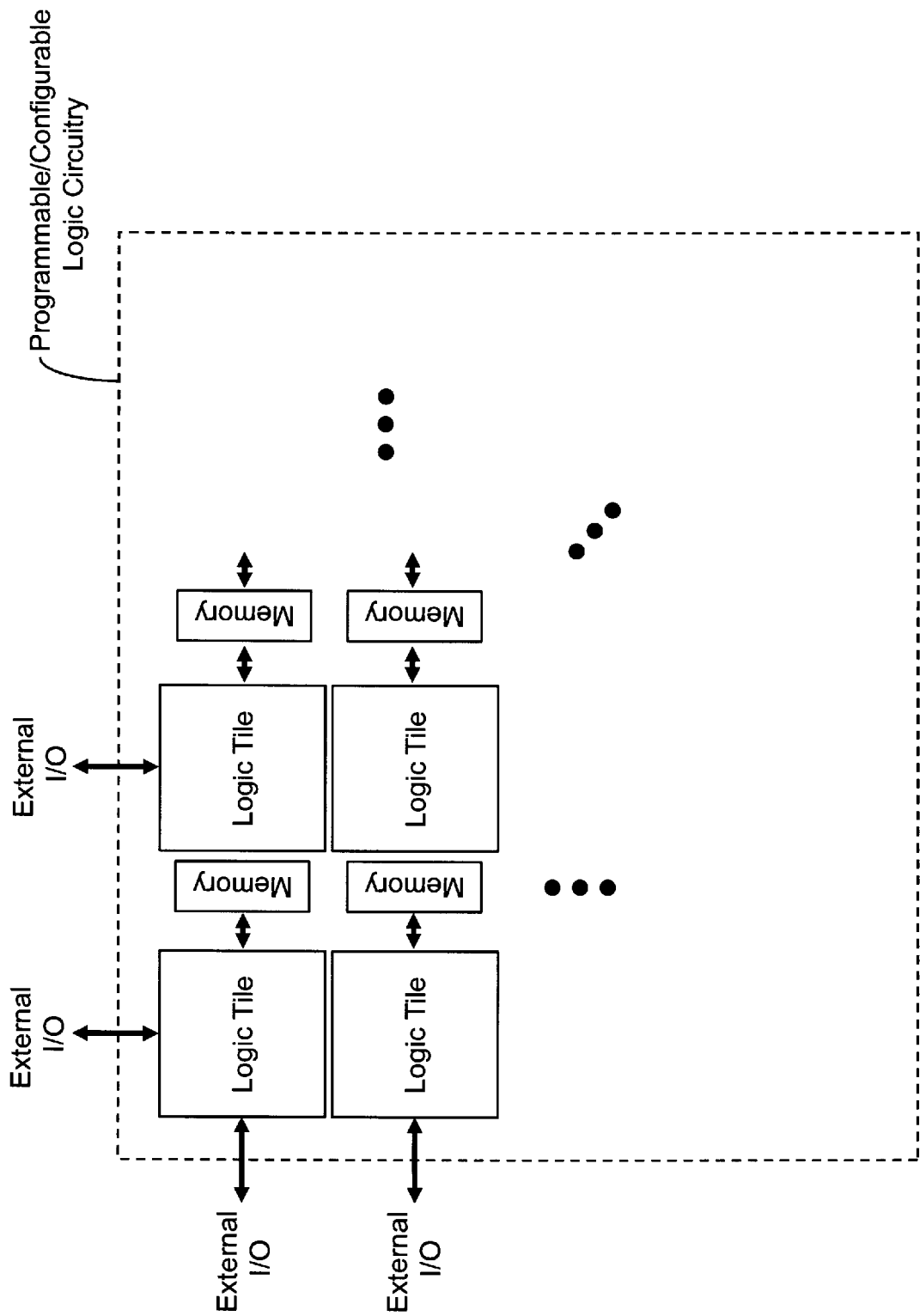
Figure 5A:
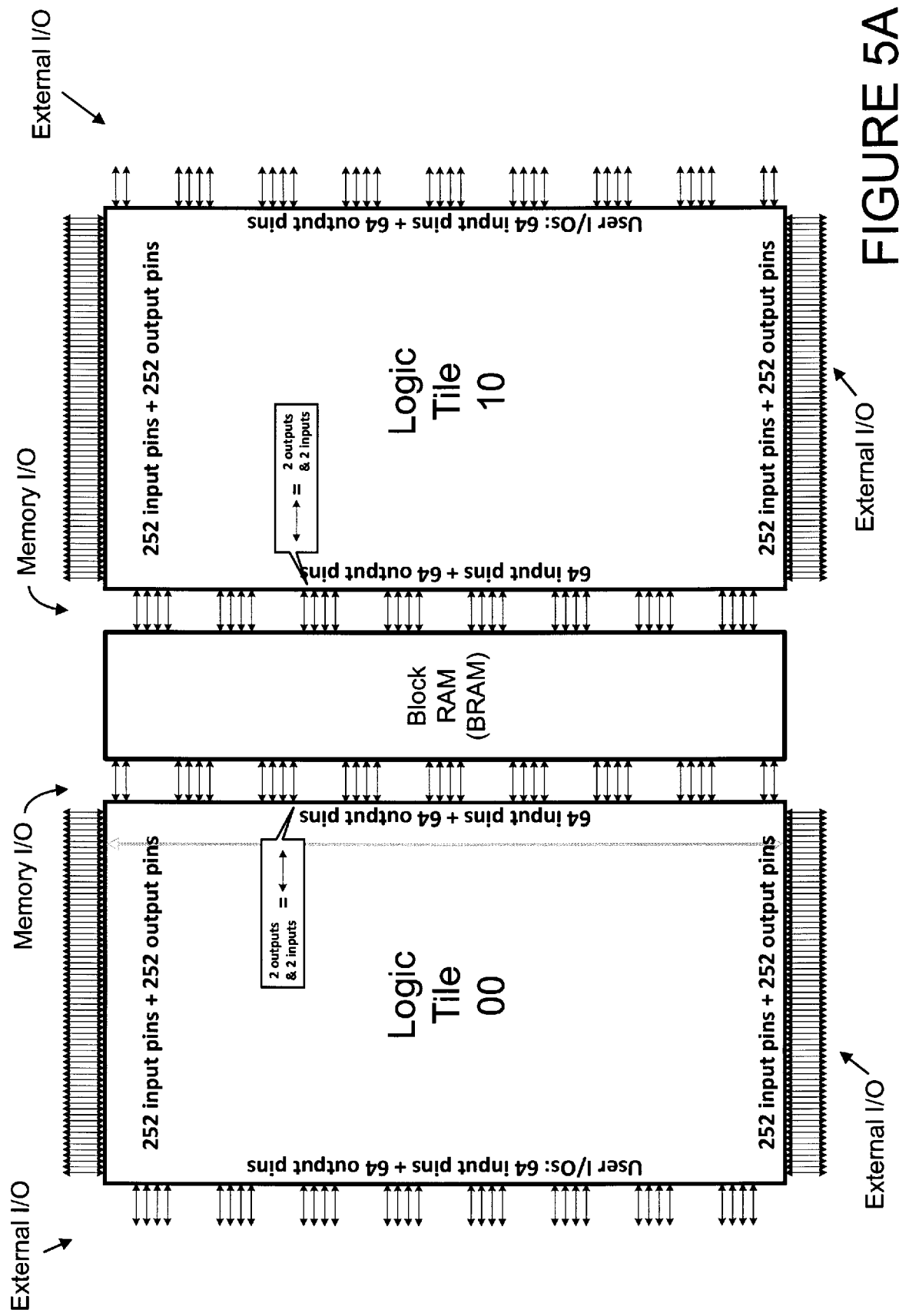
FIGS. 5A-5D illustrate exemplary schematic block diagram representations of an exemplary layout of logic tiles and block random access memory, such as DRAM, SRAM, Flash, EPROM, EEPROM and/or MRAM, according to certain aspects of the present inventions wherein, in these illustrative embodiments, the block or array of memory is disposed between consecutive logic tiles and/or located adjacent to logic tiles of the array of logic tiles of the programmable/configurable logic circuitry and is electrically coupled to one or more such logic tiles via memory I/O which, in this embodiment, correspond to the unused I/O of the logic tiles (for example, one or more I/O pins and associated I/O circuitry or blocks that are not employed to interconnect circuitry of the logic tile and circuitry external to the programmable/configurable logic circuitry and, in this exemplary embodiment, correspond to I/O pins and I/O circuitry or blocks that are not located on a periphery or perimeter of the programmable/configurable logic circuitry (again, an I/O pin is the physical point of entry/exit of the signal; all physical forms of entry/exit of the signal to the logic tile are intended to fall within the scope of the present invention)
Figure 5B:
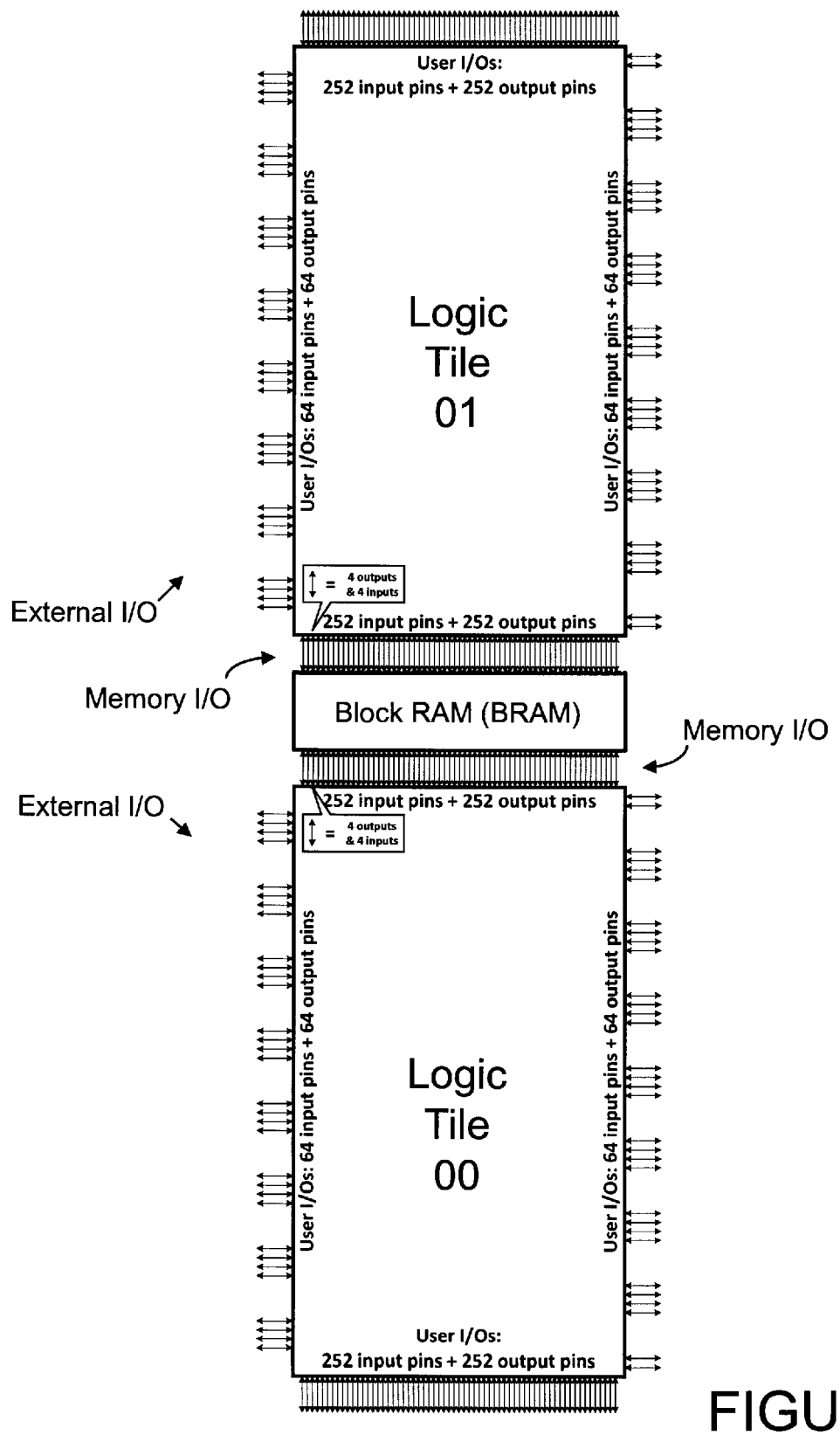
Figure 5C:
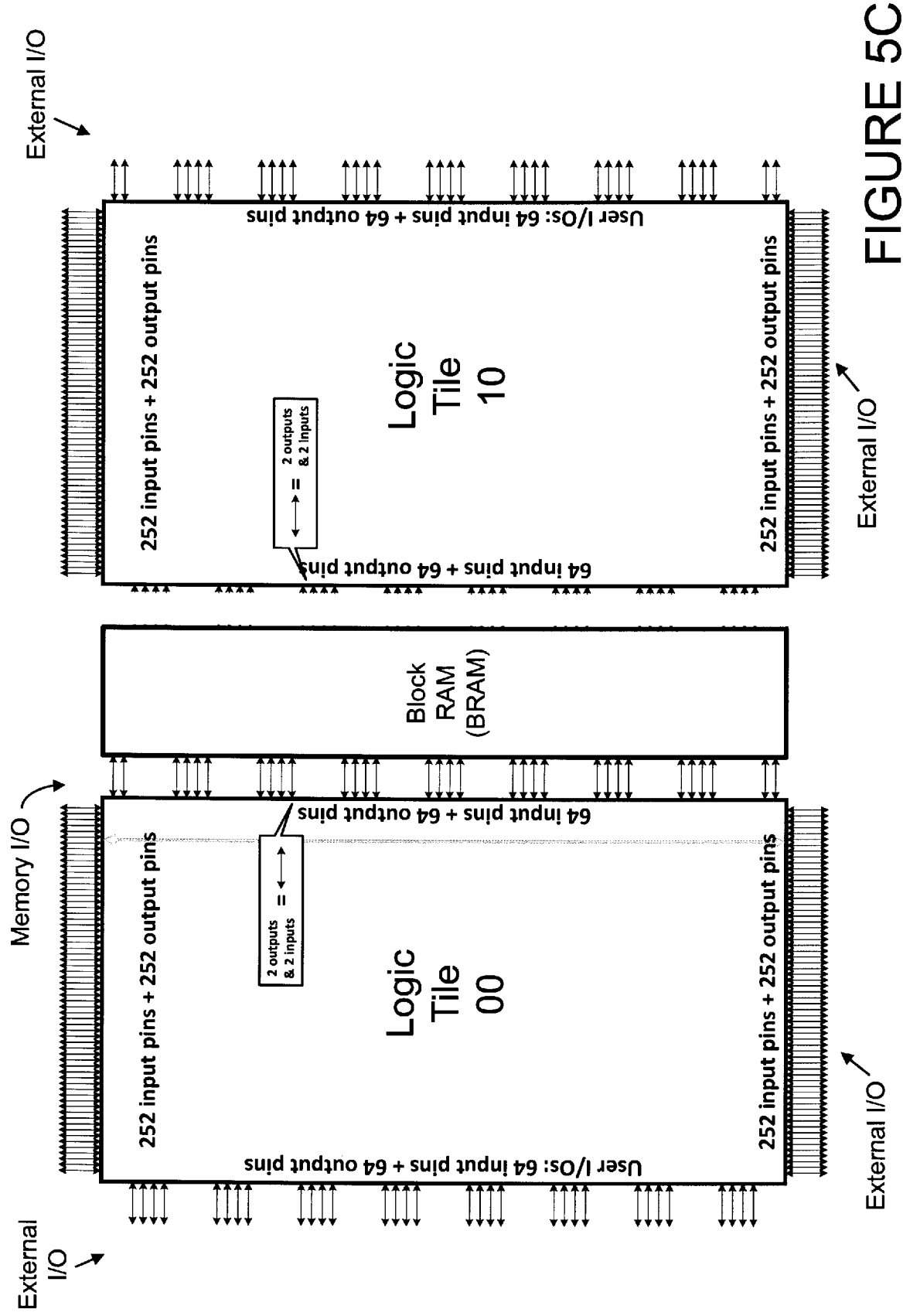
Figure 5D:
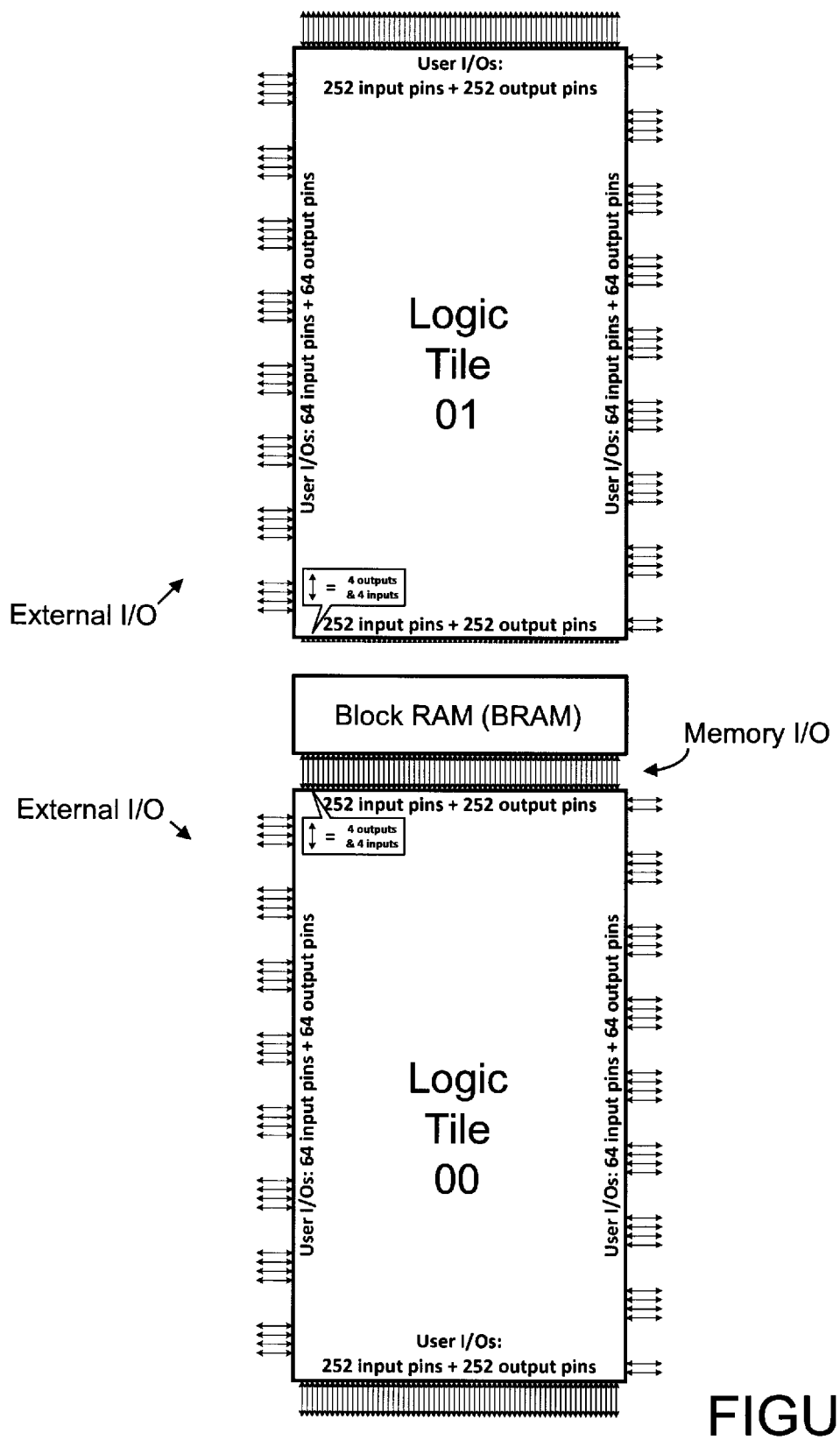

With reference to FIGS. 3A, 5A and 5B, in one exemplary embodiment, memory (BRAM) is connected to juxtaposed logic tiles via I/O "pins". In this regard, data, address and control signals of the memory may be applied to/from the unused I/O pins of the logic tiles. (Compare Logic Tile 00, Logic Tile 10 and Logic Tile 01 of FIG. 4 to Logic Tile 00, Logic Tile 10 and Logic Tile 01 of FIGS. 5A and 5B). In this embodiment, those I/O pins located on the perimeter and juxtaposed and interface with the memory are memory I/O. As noted above, I/O circuitry is associated with such I/O pins.

Figure 6A:
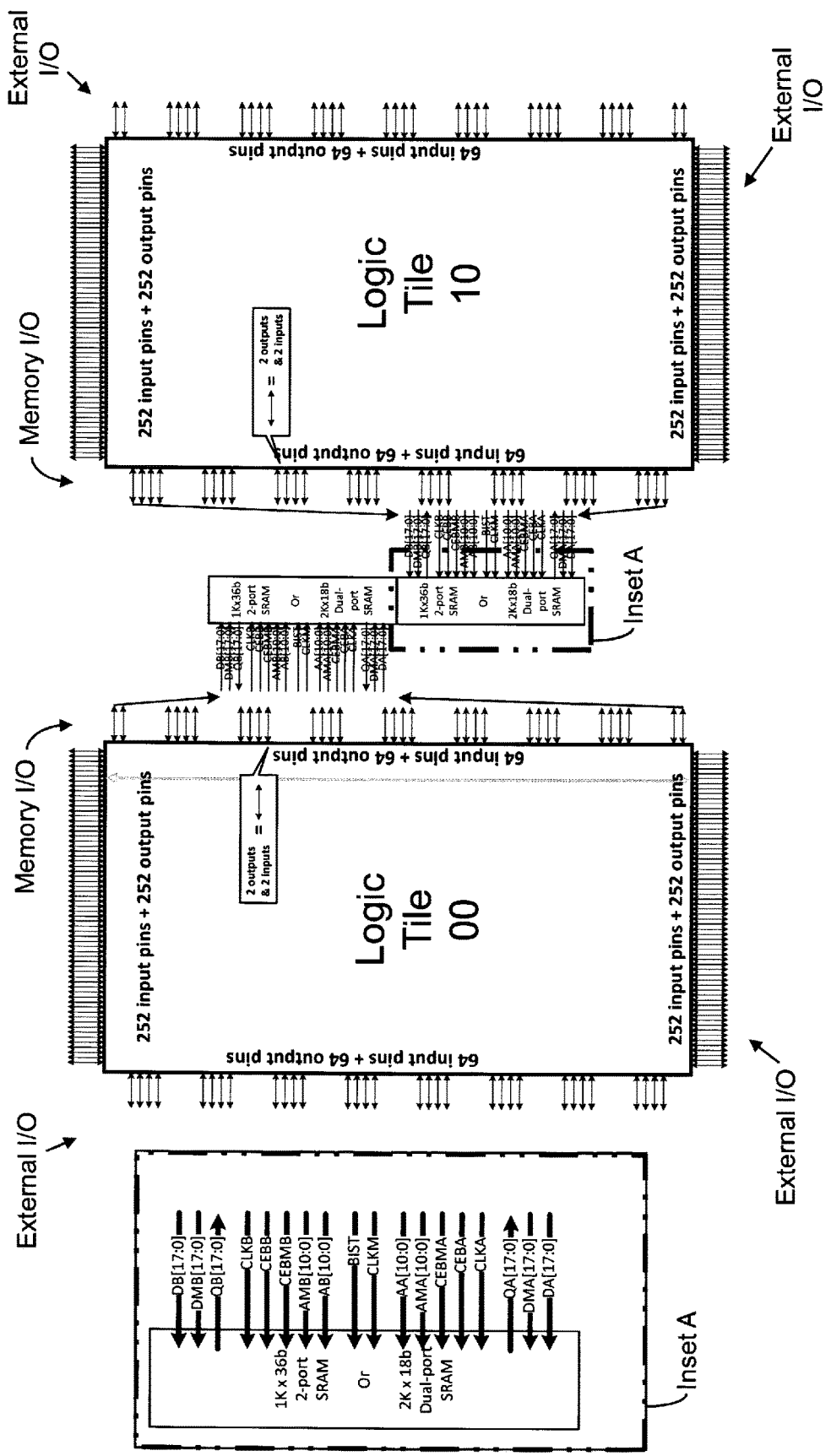
FIGS. 6A and 6B illustrate exemplary schematic block diagram representations of an exemplary layout of logic tiles and block two-port or dual-port SRAM (for example, 1K×36b 2-port RAM (1R1W) or 2K×18b true dual-port RAM) according to certain aspects of the present inventions wherein, in these illustrative embodiments, the block or array of memory is electrically coupled to associated logic tiles memory I/O which, in this embodiment, correspond to the unused I/O of the logic tiles (the I/O pins (and associated I/O circuitry or blocks) which are not located on a periphery or perimeter of the programmable/configurable logic circuitry—see, for example, FIG. 4); notably, Inset A illustrates the signals for the two-port or dual-port SRAM implementation); in one embodiment, the present inventions may include ECC circuitry (see FIG. 6B); importantly, although the memory in illustrative embodiment is SRAM, the block dynamic or static random access memory may be DRAM, Flash, EPROM, EEPROM and/or MRAM or any other memory now known or later developed.
Figure 6B:
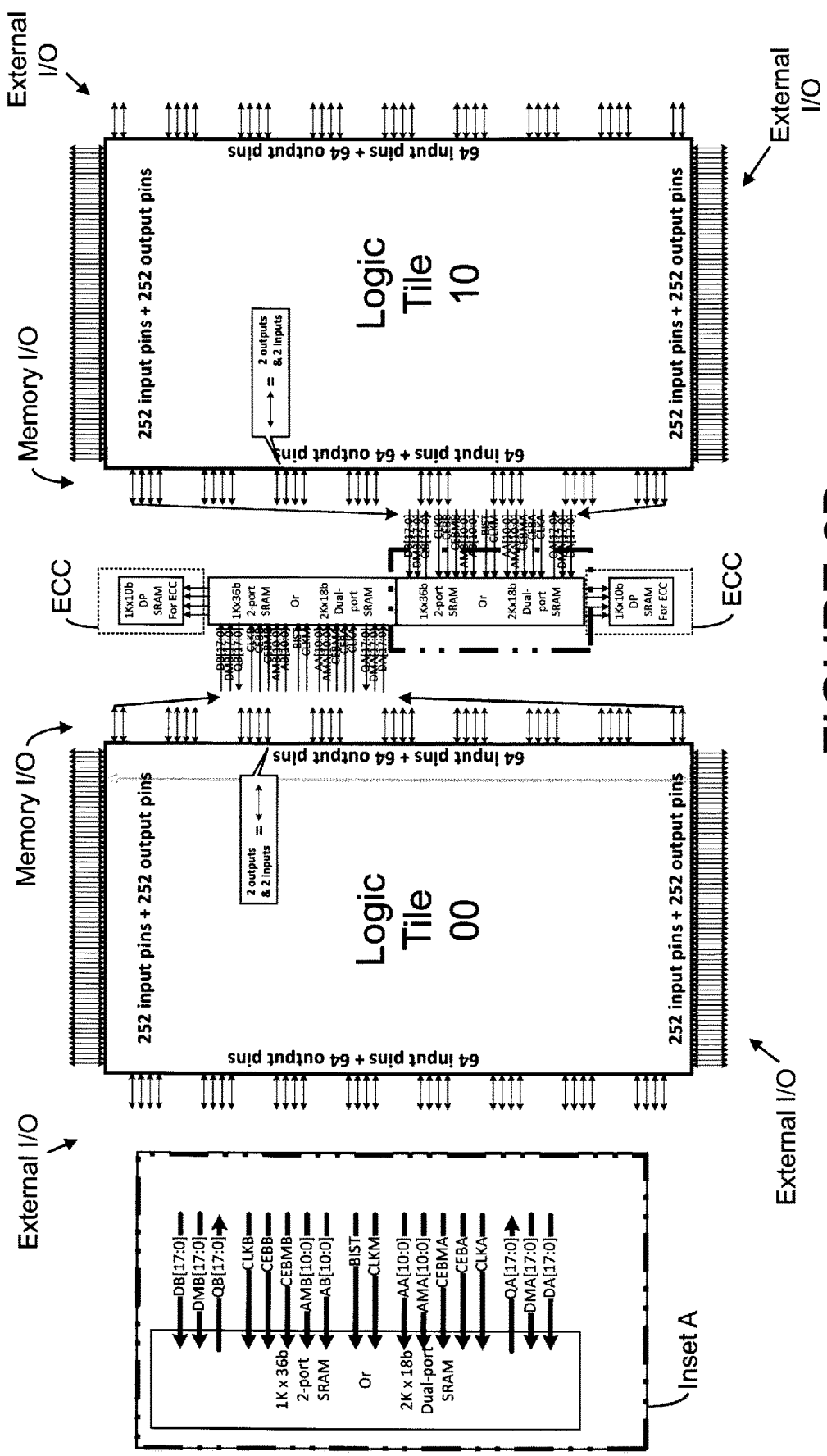
Figure 6C:
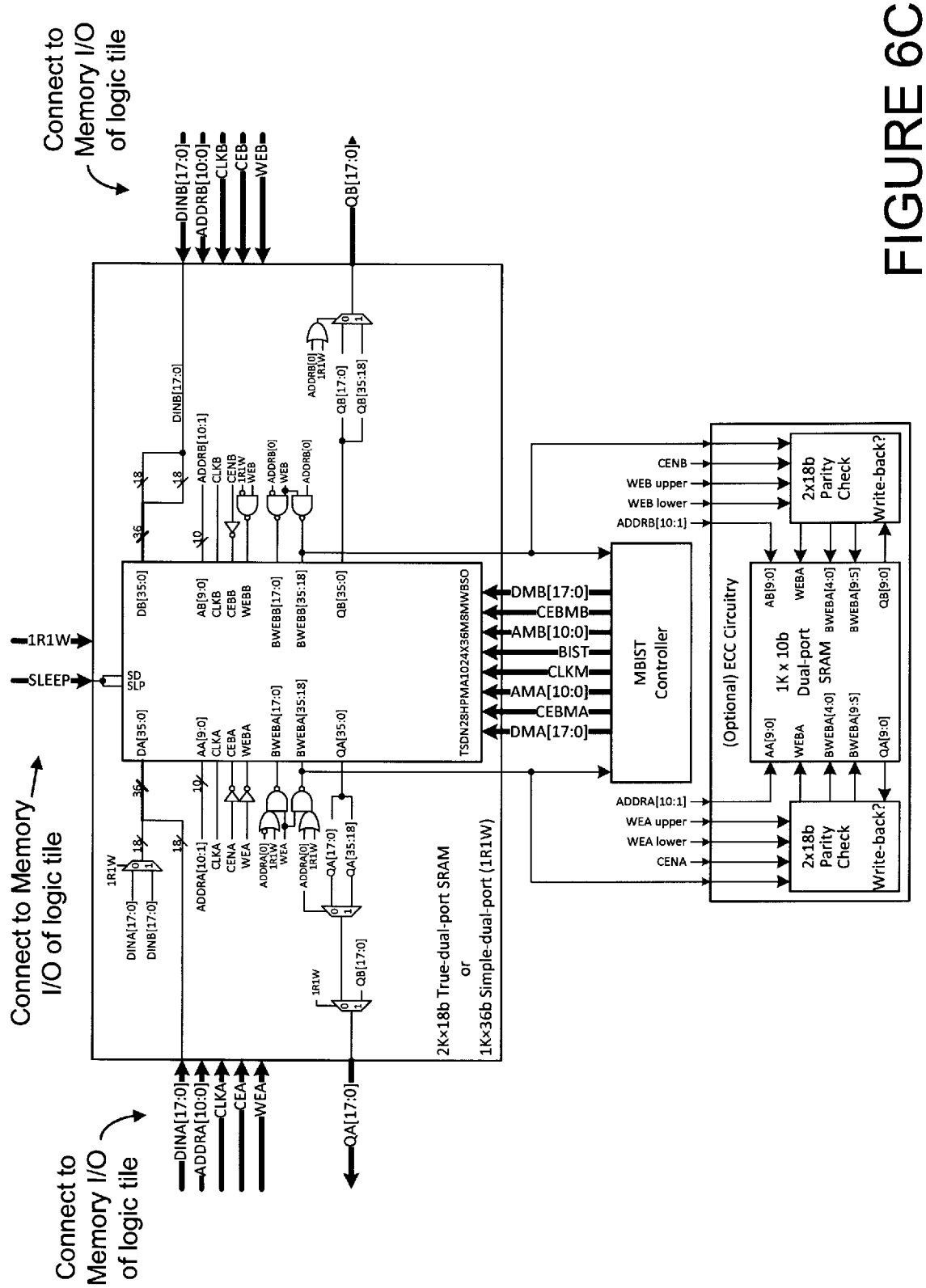
FIG. 6C illustrates an exemplary schematic block diagram of certain auxiliary logic employed in a 1K×36b two-port (1R1W) and 2K×18b true-dual-port configuration of the dual-port SRAM implementation illustrated in FIGS. 6A and 6B, according to certain aspects of the present inventions; for clarity, the logic tiles are not illustrated; in these illustrative embodiments, the block or array of memory is electrically coupled to associated logic tiles memory I/O (see, for example, FIGS. 5A, 6A and 6B) which, in this embodiment, correspond to the unused I/O of the logic tiles (here, the I/O pins which are not located on a periphery or perimeter of the programmable/configurable logic circuitry may be employed (with associated I/O circuitry or blocks) to interface with memory adjacent thereto—compare, for example, FIG. 4)

Notably, the memory may consist of one or more arrays or blocks that are suitably organized, designed or configured to connect to the associated logic tile(s). For example, in one embodiment, the memory may be a two-port or dual-port type memory (for example, two-port or dual-port SRAM) which allows two logic tiles that are juxtaposed the memory to interface with and access data in the memory. With reference to FIGS. 5A, 6A and 6B, logic tiles 00 and 10 connect to the memory juxtaposed to opposing sides of the memory. Indeed, in one exemplary embodiment, the two-port or dual-port SRAM may be 1K×36b 2-port RAM (1R1W) or 2K×18b true dual-port RAM.

Figure 7:
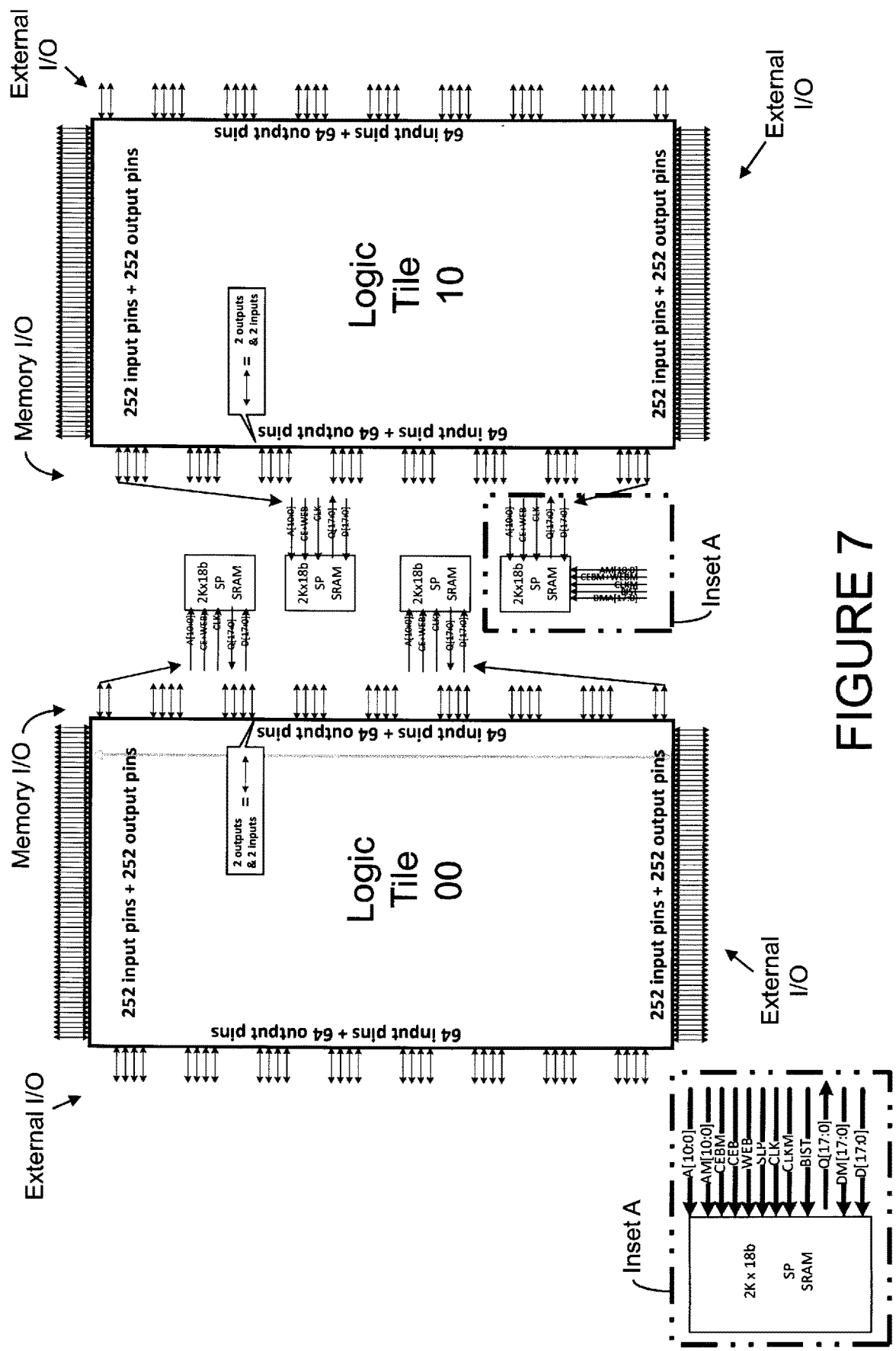
FIG. 7 illustrates an exemplary schematic block diagram representations of an exemplary layout of logic tiles and block single-port SRAM (for example, two instances of logic tiles with four instances 2K×18b single-port SRAM, for a total of 144 Kb of SRAM) according to certain aspects of the present inventions wherein, in these illustrative embodiments, the block or array of memory is electrically coupled to associated logic tiles memory I/O which, in this embodiment, correspond to the unused I/O of the logic tiles (here, the I/O pins (and associated I/O circuitry or blocks) which are not located on a periphery or perimeter of the programmable/configurable logic circuitry—compare, for example, FIG. 4); notably, Inset A illustrates the signals for the single-port SRAM implementation); importantly, although the memory in illustrative embodiment is SRAM, the block dynamic or static random access memory may be DRAM, Flash, EPROM, EEPROM and/or MRAM or any other memory now known or later developed, all of which are intended to fall within the scope of the present inventions.

With reference to FIGS. 5A and 7, in another exemplary embodiment, the memory is a single port memory (for example, a single-port SRAM). In one particular embodiment, the single port memory may be four instances of 2K×18b, amounting to 144 Kb total SRAM.

Figure 8A:
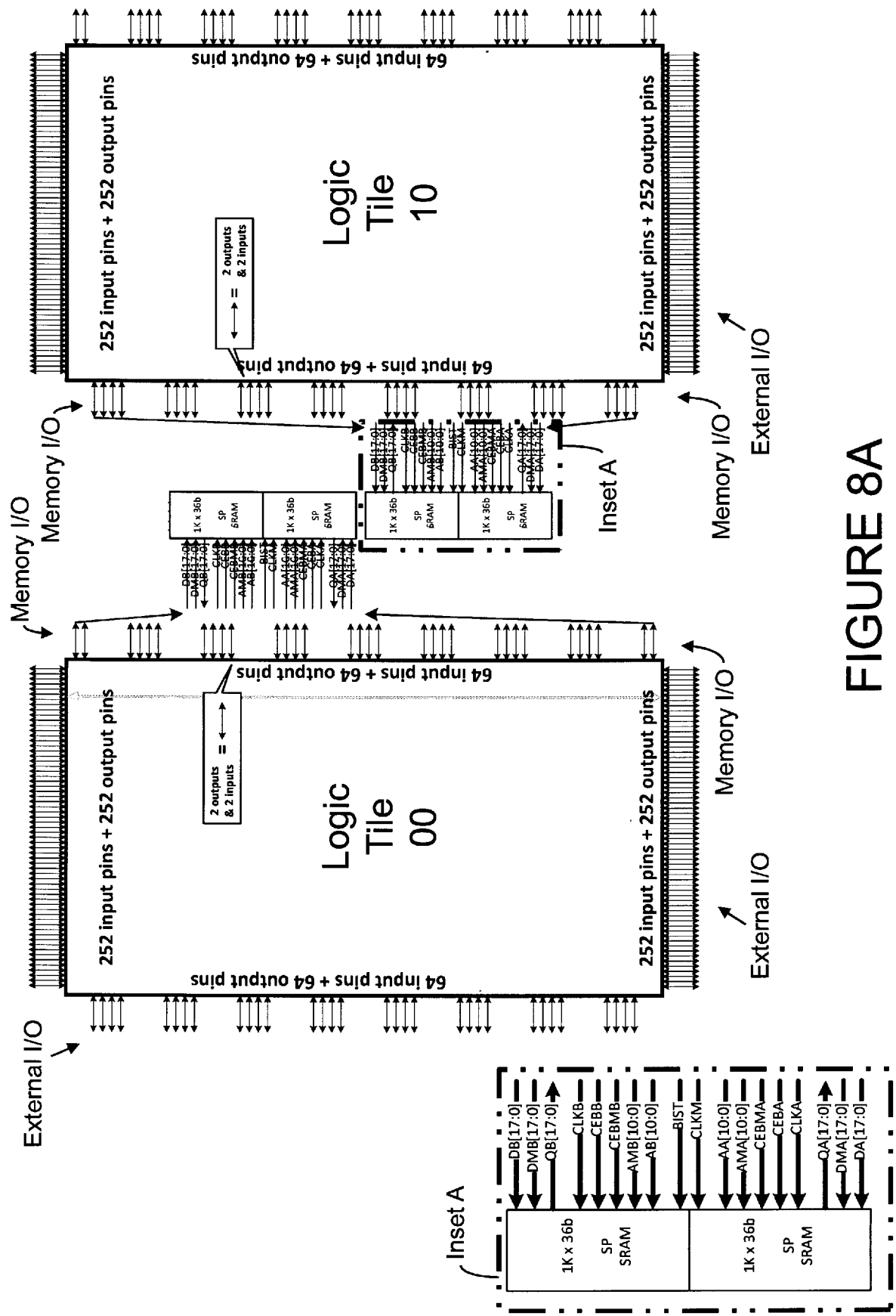
FIGS. 8A and 8B illustrate exemplary schematic block diagram representations of an exemplary layout of logic tiles and block single-port SRAM (for example, four instances of 1K×36b 2-port RAM (1R1W)—2K×18b single-port RAM or two ping-pong buffers of 2K×36b) in an single-port ping-pong buffer architecture, according to certain aspects of the present inventions wherein, in these illustrative embodiments, again, in this embodiment, the block or array of memory is electrically coupled to associated logic tiles memory I/O which correspond to the unused I/O of the logic tiles; notably, Inset A illustrates the signals for the single-port SRAM implementation), in one embodiment, an architecture according to the present inventions may employ ECC circuitry (see FIG. 8B); importantly, as noted above, although the memory in illustrative embodiment is SRAM, the block dynamic or static random access memory may implemented using any memory (including type and/or architecture) now known or later developed.
Figure 8B:
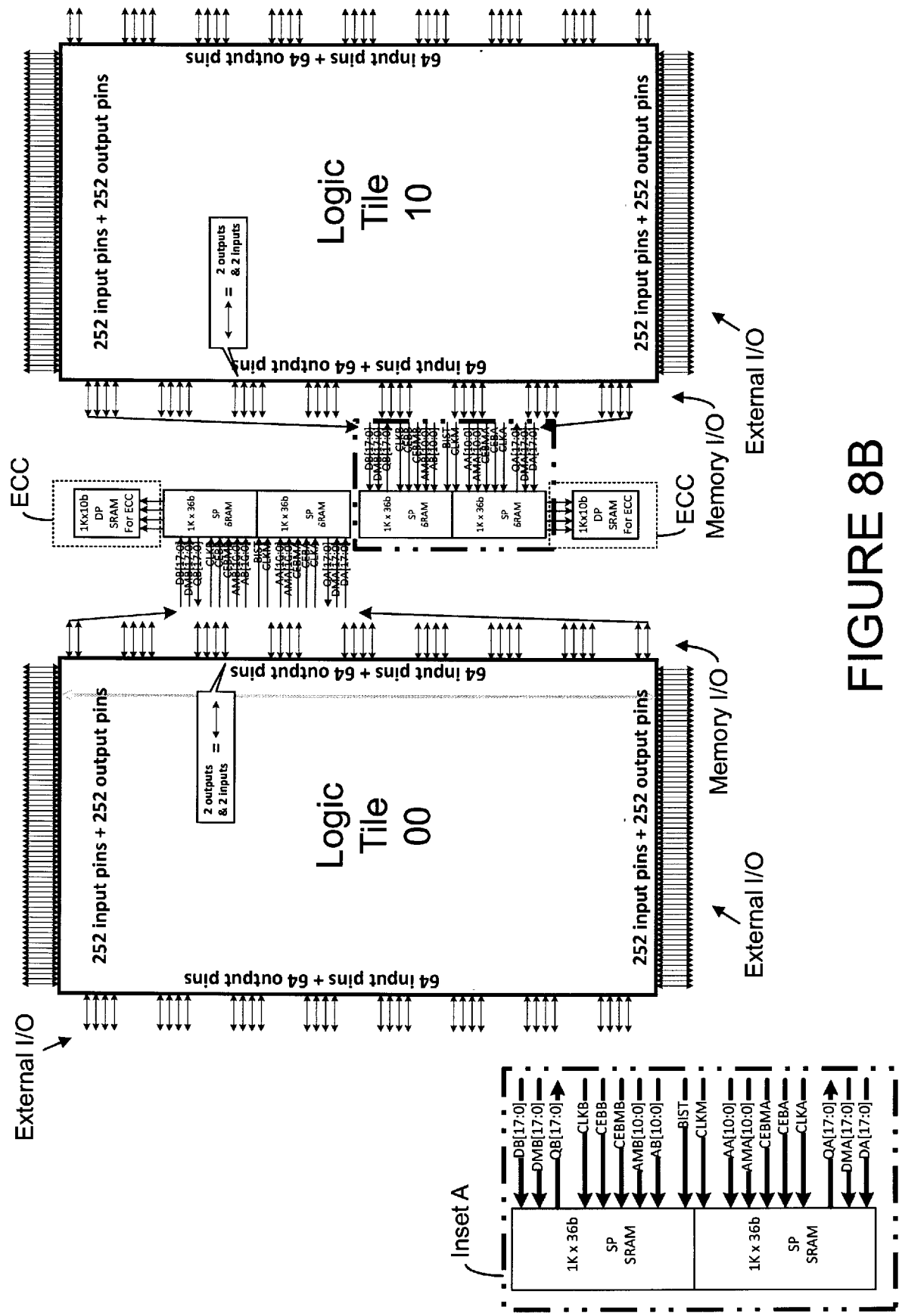
Figure 8C:
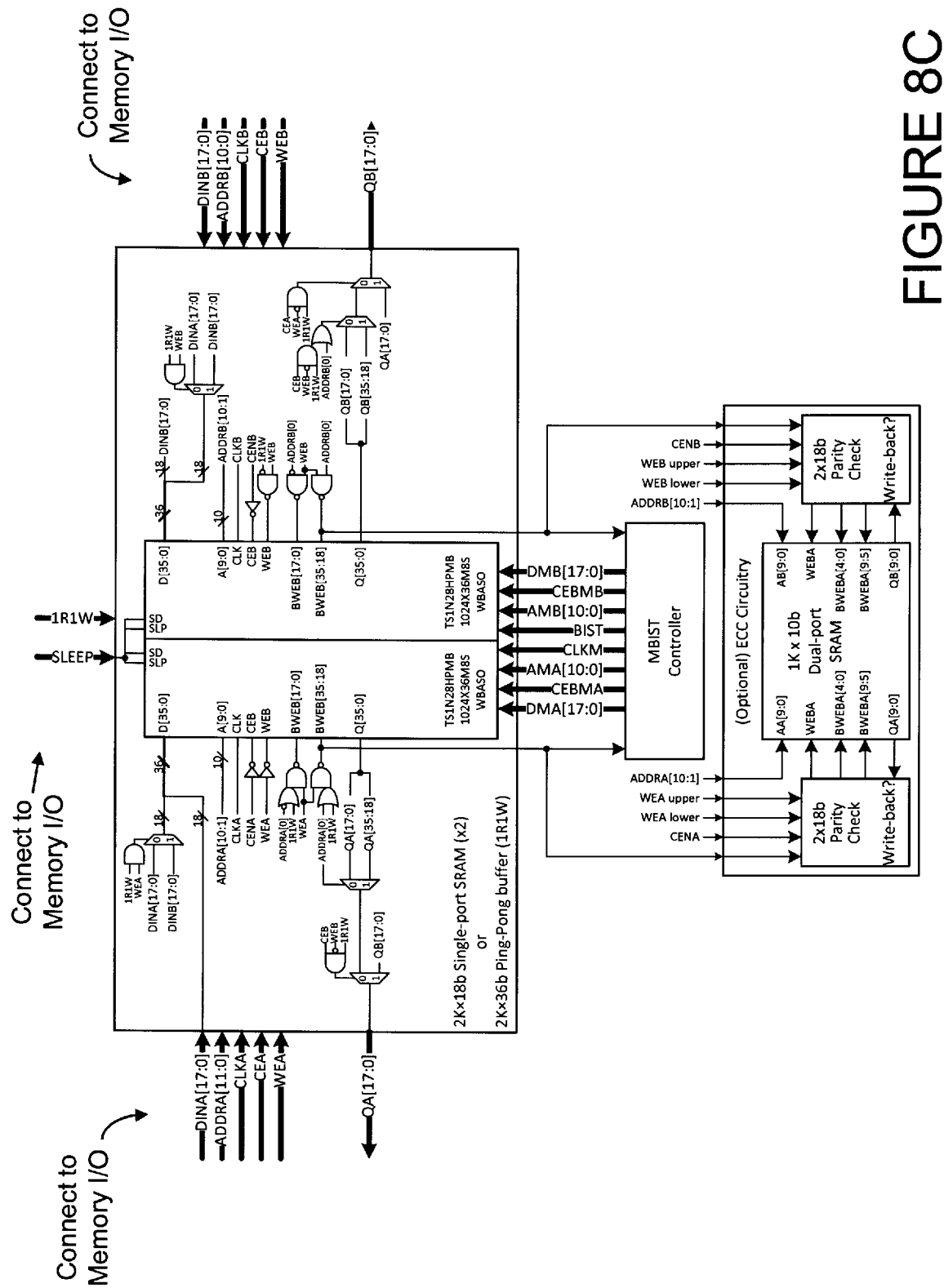
FIG. 8C illustrates an exemplary schematic block diagram of certain auxiliary logic employed in a 2K×36b ping-pong buffer and two 2K×18b single-port configuration of the single-port SRAM implementation illustrated in FIGS. 8A and 8B, according to certain aspects of the present inventions; for clarity, the logic tiles are not illustrated; in these illustrative embodiments, the block or array of memory is electrically coupled to associated logic tiles memory I/O (see, for example, FIGS. 5A, 8A and 8B) which, in this embodiment, correspond to the unused I/O of the logic tiles (here, the I/O pins which are not located on a periphery or perimeter of the programmable/configurable logic circuitry and associated I/O circuitry or blocks are available to interface with memory—compare, for example, FIG. 4)
Figure 9A:
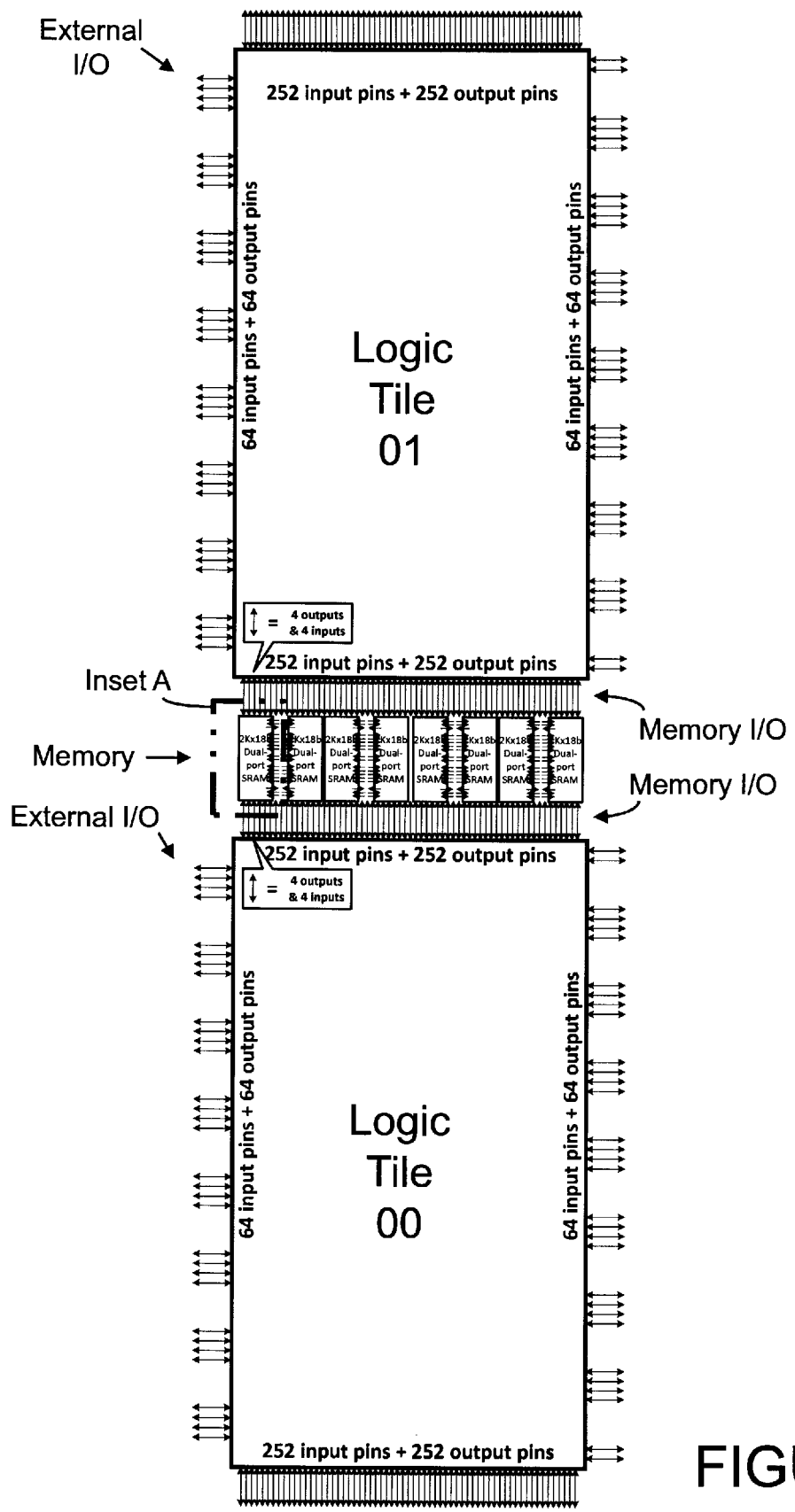
FIG. 9A illustrates an exemplary schematic block diagram representations of another exemplary layout of logic tiles and block dual-port SRAM (for example, eight instances of 2K×18b) according to certain aspects of the present inventions wherein, in these illustrative embodiments, the block or array of memory is electrically coupled to associated logic tiles memory I/O which, in this embodiment, correspond to the unused I/O of the logic tiles (the I/O pins which are not located on a periphery or perimeter of the programmable/configurable logic circuitry and, as such, these I/O pins and associated I/O circuitry or blocks are available to interface with memory disposed between consecutive logic tiles—compare, for example, FIG. 4); notably, Inset A illustrated in FIG. 9C) illustrates the signals for the dual-port SRAM implementation); in this embodiment, auxiliary logic need not be employed to convert between 1R1W to dual port; as in the other exemplary embodiments, although the memory in illustrative embodiment is SRAM, the block dynamic or static random access memory may be any other memory now known or later developed.
Figure 9B:
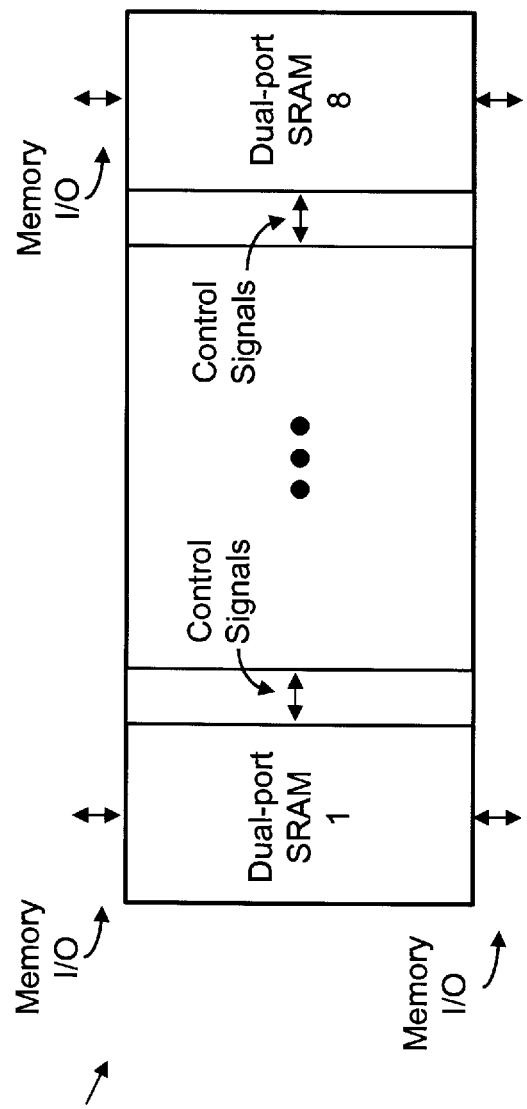
FIG. 9B illustrates a block diagram of the memory disposed between the logic tiles of the array of logic tiles of the programmable/configurable logic circuitry as illustrated in FIG. 9A wherein, in this exemplary embodiment, the memory disposed between consecutive logic tiles of the array of logic tiles includes eight instances of dual-port SRAM (for clarity purposes, the signal inputs and signals thereof which connect to the memory I/O of an associated logic tile are not illustrated)
Figure 9C:
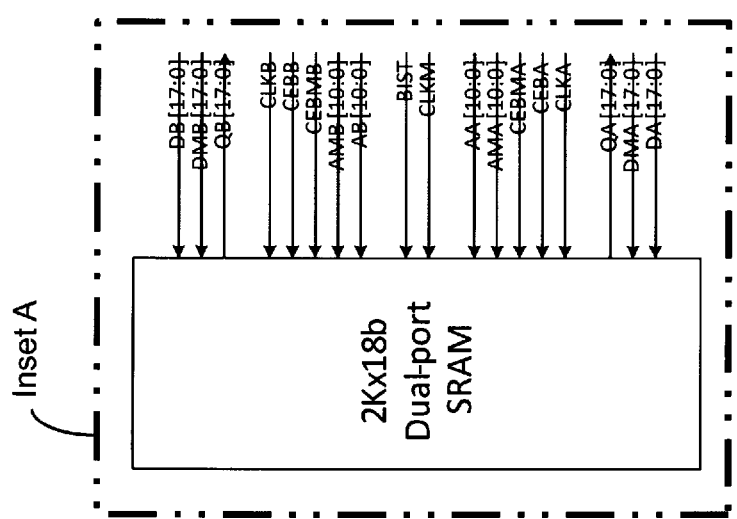
FIG. 9C illustrates Inset A of FIG. 9A which depicts the dual-port SRAM implementation including the signals thereof which connect to the memory I/O of an associated logic tile.

With reference to FIGS. 5A, 8A and 8B, in yet another exemplary embodiment, the memory is a single-port memory (for example, a single-port SRAM) in a single-port ping-pong buffer architecture. For example, the single-port ping-pong buffer architecture may include four instances of 1K×36b 2-port RAM (1R1W) or 2K×18b single-port RAM, or two ping-pong buffers of 2K×36b.

With reference to FIGS. 5B, 9A, 9B and 9C, in another exemplary embodiment, the memory is a dual-port memory (for example, a dual-port SRAM). The dual-port memory may be comprised of eight instances of 2K×18b which facilitates interface with a short-side or edge of the logic tile.

As noted above, the memory array or block may be SRAM, DRAM, Flash, EPROM, EEPROM and/or MRAM or any other memory now known or later developed. Thus, although many of the illustrative embodiments depict SRAM, such other memory types may also be employed.

Figure 10:
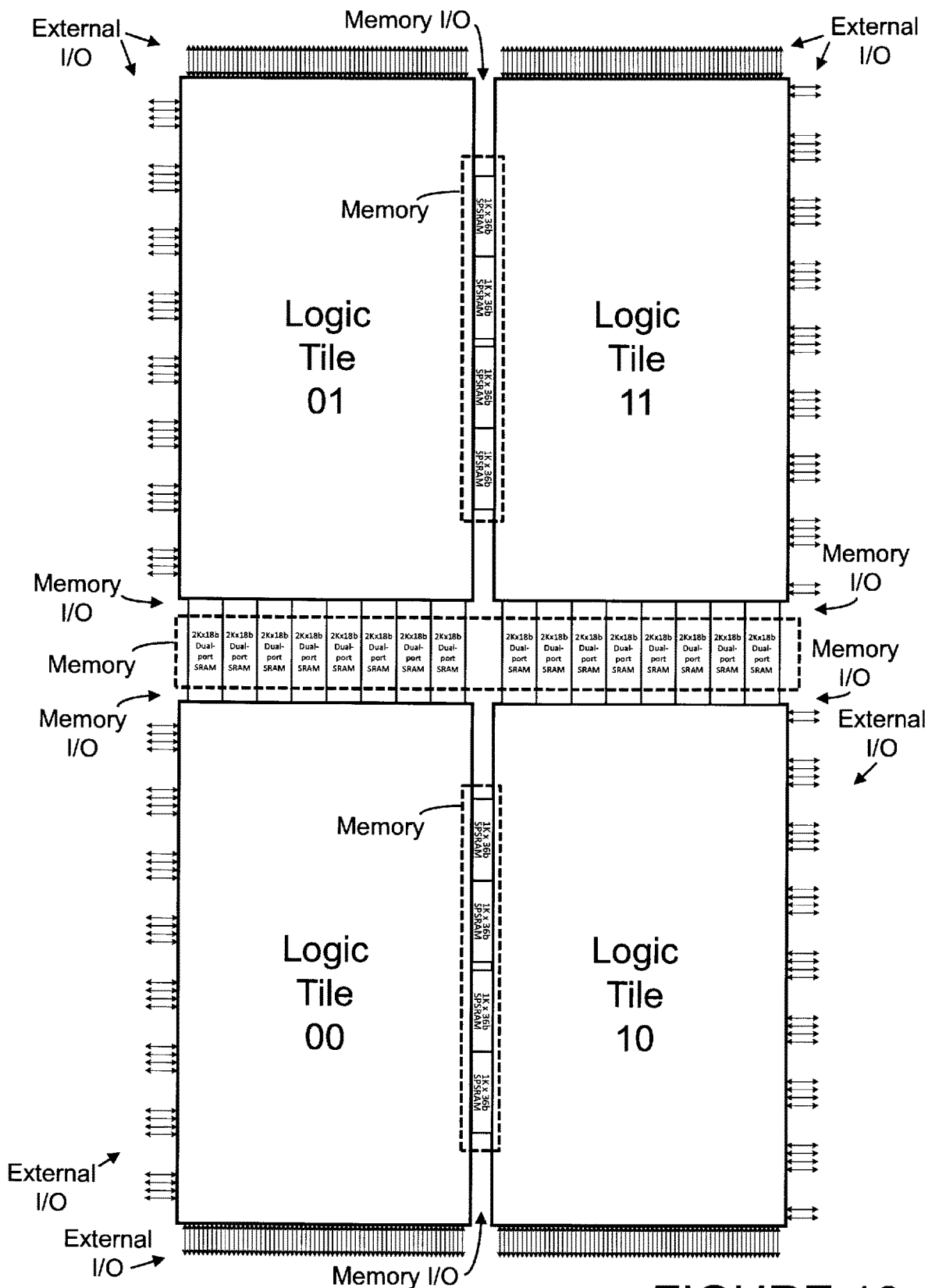
FIG. 10 illustrates an exemplary block diagram representation of exemplary programmable/configurable logic circuitry according to certain aspects of the present inventions, wherein, in this exemplary embodiment, the programmable/configurable logic circuitry includes four logic tiles and memory I/O pins of the logic tiles are disposed internal to the periphery of the programmable/configurable logic circuitry (i.e., that are not disposed on the periphery of the programmable/configurable logic circuitry—see, for example, FIG. 4) and external I/O pins that are available for access by circuitry external to the programmable/configurable logic circuitry, according to certain aspects of the present inventions; notably, in this exemplary embodiment of a 2×2 array of logic tiles, memory is disposed on each edge or side of the adjacent logic tiles and couple to the memory I/O pins of the logic tiles to facilitate communication between the memory and the logic tile adjacent thereto; in one embodiment, dual-port memory is disposed between (i) logic tile 00 and logic tile 01 and (ii) logic tile 10 and logic tile 11, and single-port memory is disposed between (i) logic tile 01 and logic tile 11 and (ii) logic tile 00 and logic tile 10; in one aspect the memory scales linearly with (N−1)×(N−1) array.
Figure 11:
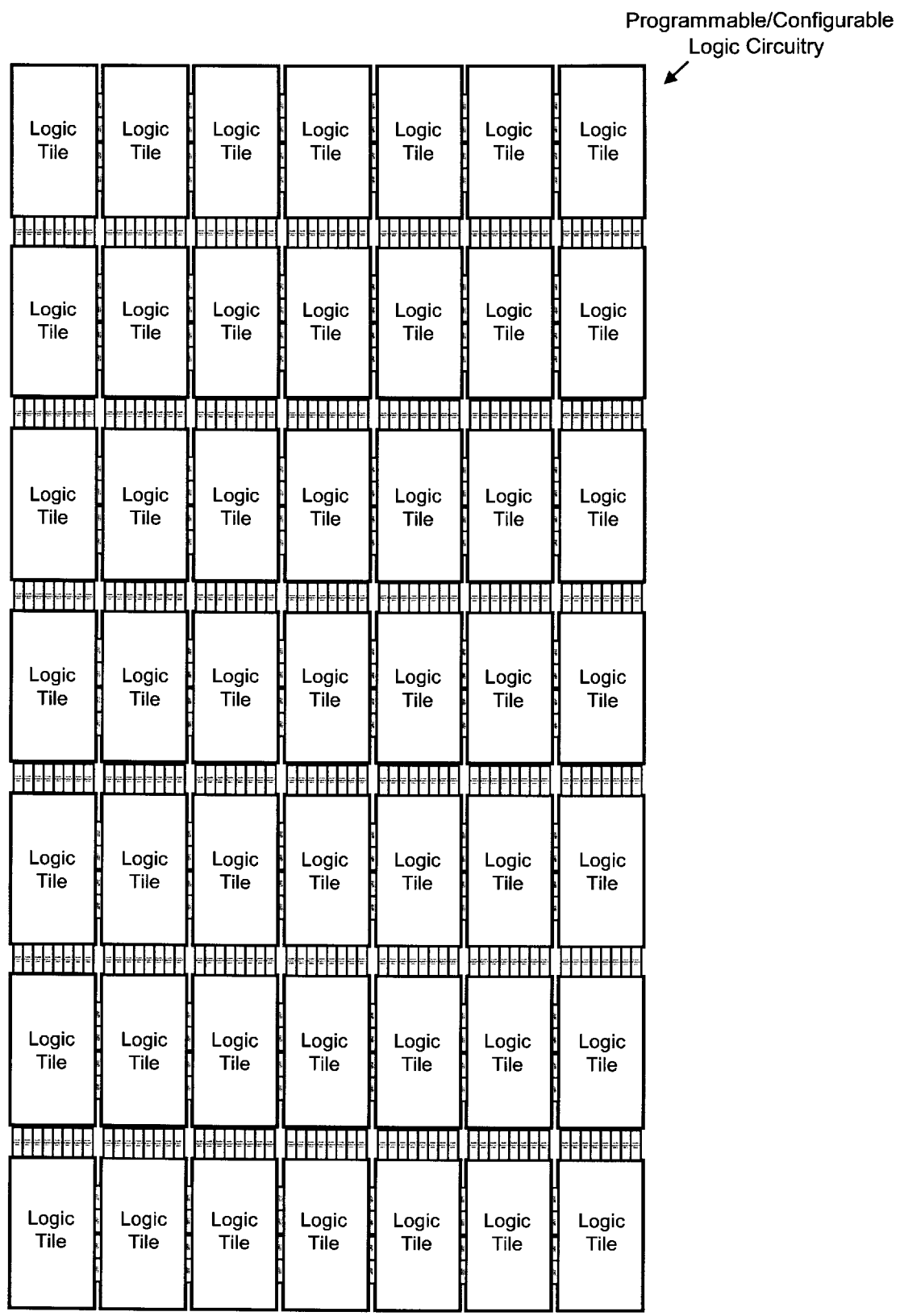
FIG. 11 illustrates an exemplary block diagram representation of exemplary programmable/configurable logic circuitry (7×7 logic tile configuration) according to certain aspects of the present inventions, wherein the programmable/configurable logic circuitry includes forty-nine logic tiles and memory I/O of the logic tiles are disposed internal to the periphery of the programmable/configurable logic circuitry (i.e., the I/O pins that are not disposed on the periphery of the programmable/configurable logic circuitry) and connect to block dynamic or static random access memory; external I/O (not illustrated for clarity purposes) are disposed on the periphery of the programmable/configurable logic circuitry and available for access by circuitry external to the programmable/configurable logic circuitry, according to certain aspects of the present inventions; notably, such memory may be any type now known or later developed including, for example, DRAM, SRAM, Flash, EPROM, EEPROM and/or MRAM; indeed, the programmable/configurable logic circuitry of the present inventions may employ any combination of different memory types, all of which are intended to fall within the scope of the present inventions.

With reference to FIGS. 10 and 11, in one embodiment, the programmable/configurable logic circuitry includes memory disposed on all of the sides or edges of a logic tile that do not form a portion of the perimeter of the programmable/configurable logic circuit. As noted above, the present inventions include logic tile—memory layouts where memory is not disposed on all of the sides or edges of a logic tile that do not form a portion of the perimeter of the programmable/configurable logic circuitry. (See, for example, FIGS. 3B-3H). In these embodiments, external I/O along one or more (but not all) perimeters of the logic tiles are employed to interface with memory and unused external I/O of one or more perimeters of the logic tiles are not employed to interface with memory. Here, the memory array or block may be suitably organized, designed or configured (for example, single-port or dual-port memory) to accommodate a particular logic tile—memory layout. Notably, all combinations and permutations of logic tile—memory layouts are intended to fall within the scope of the present inventions.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, the present inventions may employ any type or configuration of memory. Further, the programmable/configurable logic circuitry may include the same type of memory throughout programmable/configurable logic circuitry (for example, SRAM) or different types of memory may be employed (for example, SRAM, DRAM, Flash and/or MRAM). Notably, all combinations and/or permutations of the different types of memories are intended to fall within the scope of the present inventions.

Figure 12A:
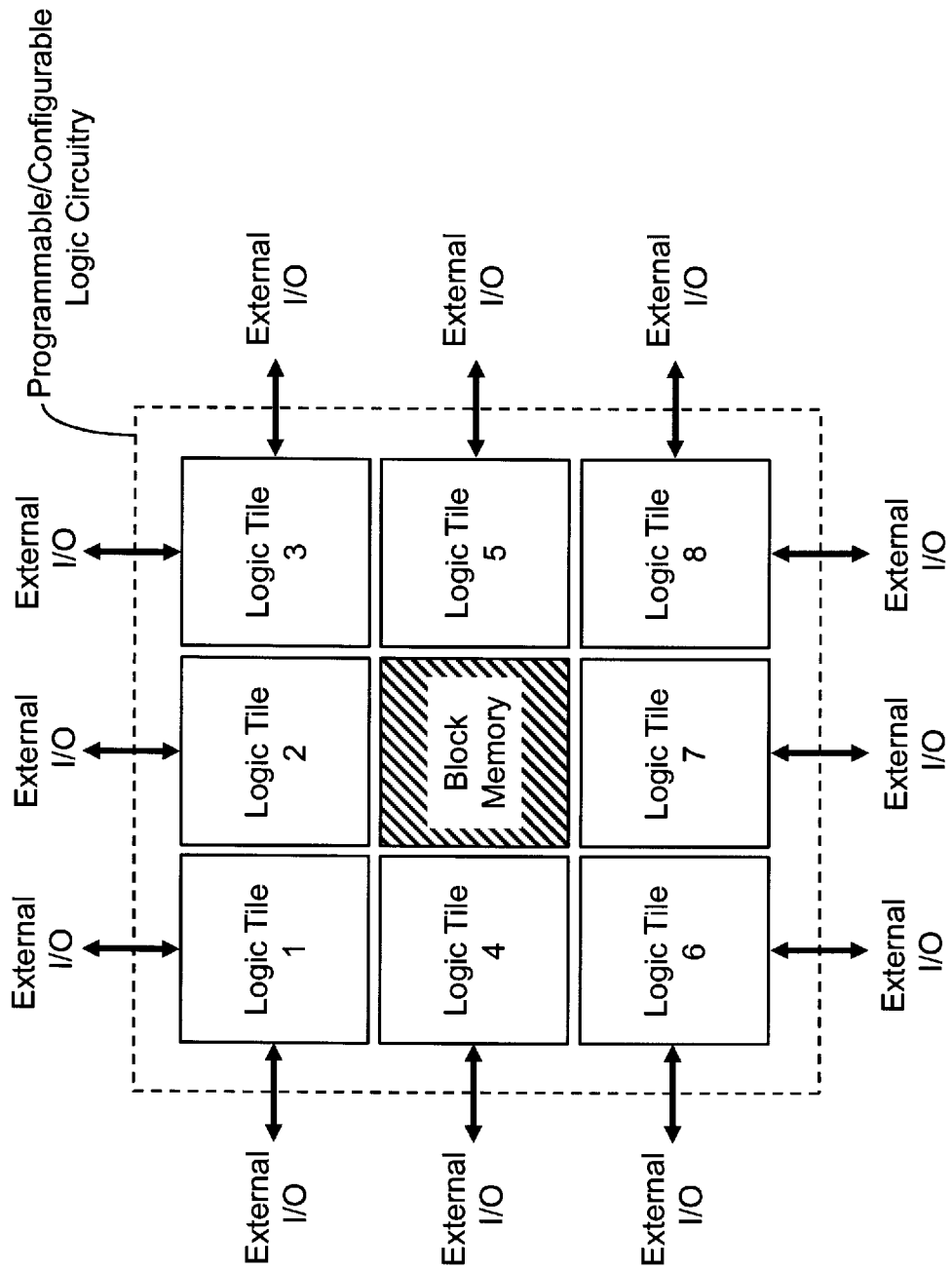
FIGS. 12A-12C illustrate an exemplary block diagram representations of exemplary programmable/configurable logic circuitry of a pseudo 3×3 logic tile architecture where memory is disposed in the location of the "center tile" region in accordance with certain aspects of the present inventions; the memory, which may be any configuration or architecture of block RAM, is in communication with and/or employed by the adjacent logic tiles; notably, any pseudo n×m logic tile architecture having block RAM located in one or more tile regions of the architecture (see, for example, FIG. 12C wherein the logic tiles 1-8 and memory may be repeated into a pseudo 9×9 logic tile architecture); in one exemplary embodiment, block memory is electrically coupled to one or more (or all) adjacent logic tiles via memory I/O which corresponds to the unused I/O of the logic tiles (for example, I/O pins and associated I/O circuitry or blocks that are not employed to interconnect circuitry of the logic tile and circuitry external to the programmable/configurable logic circuitry); such block RAM may be any type now known or later developed including, for example, DRAM, SRAM, Flash, EPROM, EEPROM and/or MRAM.
Figure 12B:
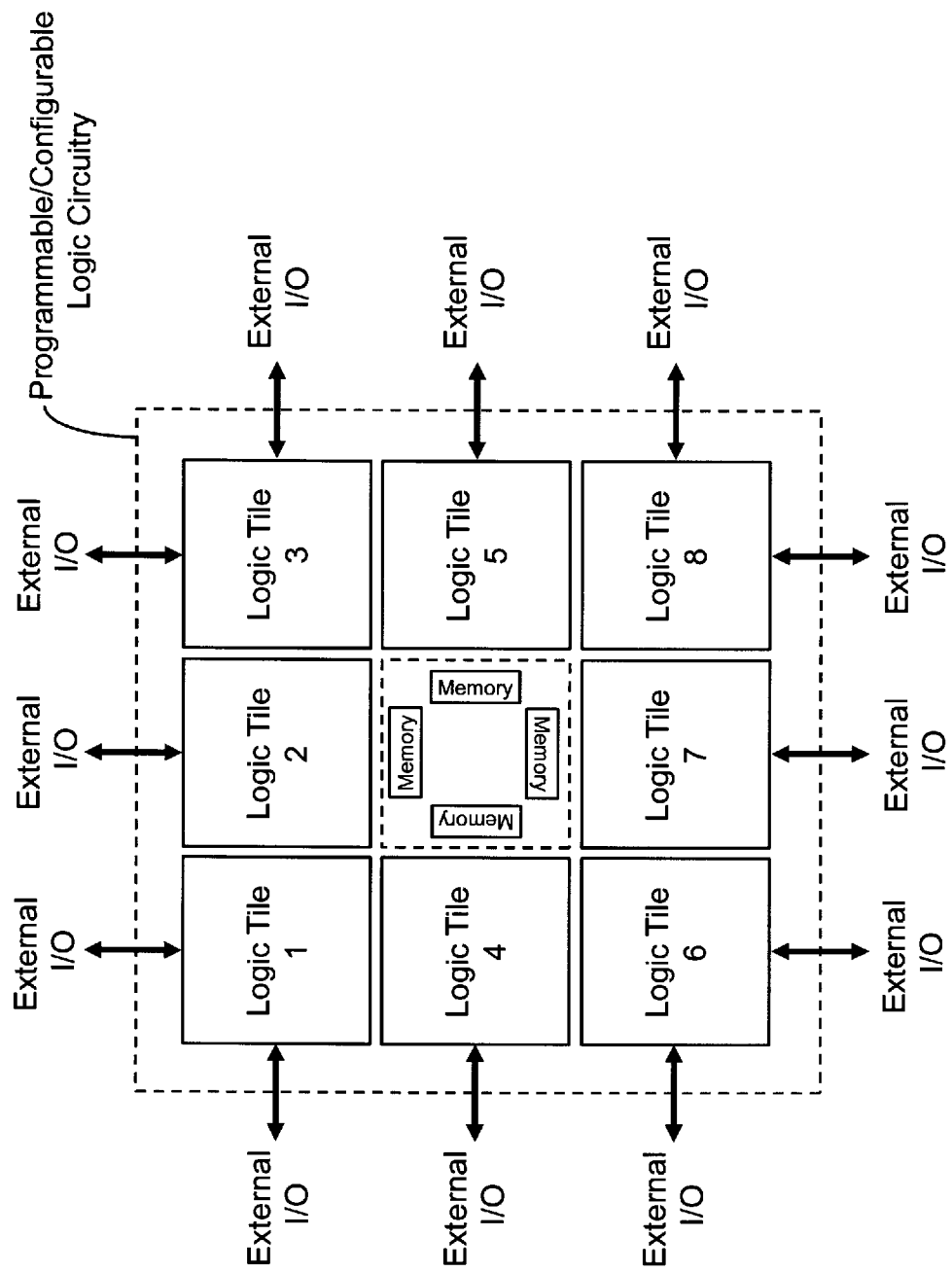
Figure 12C:
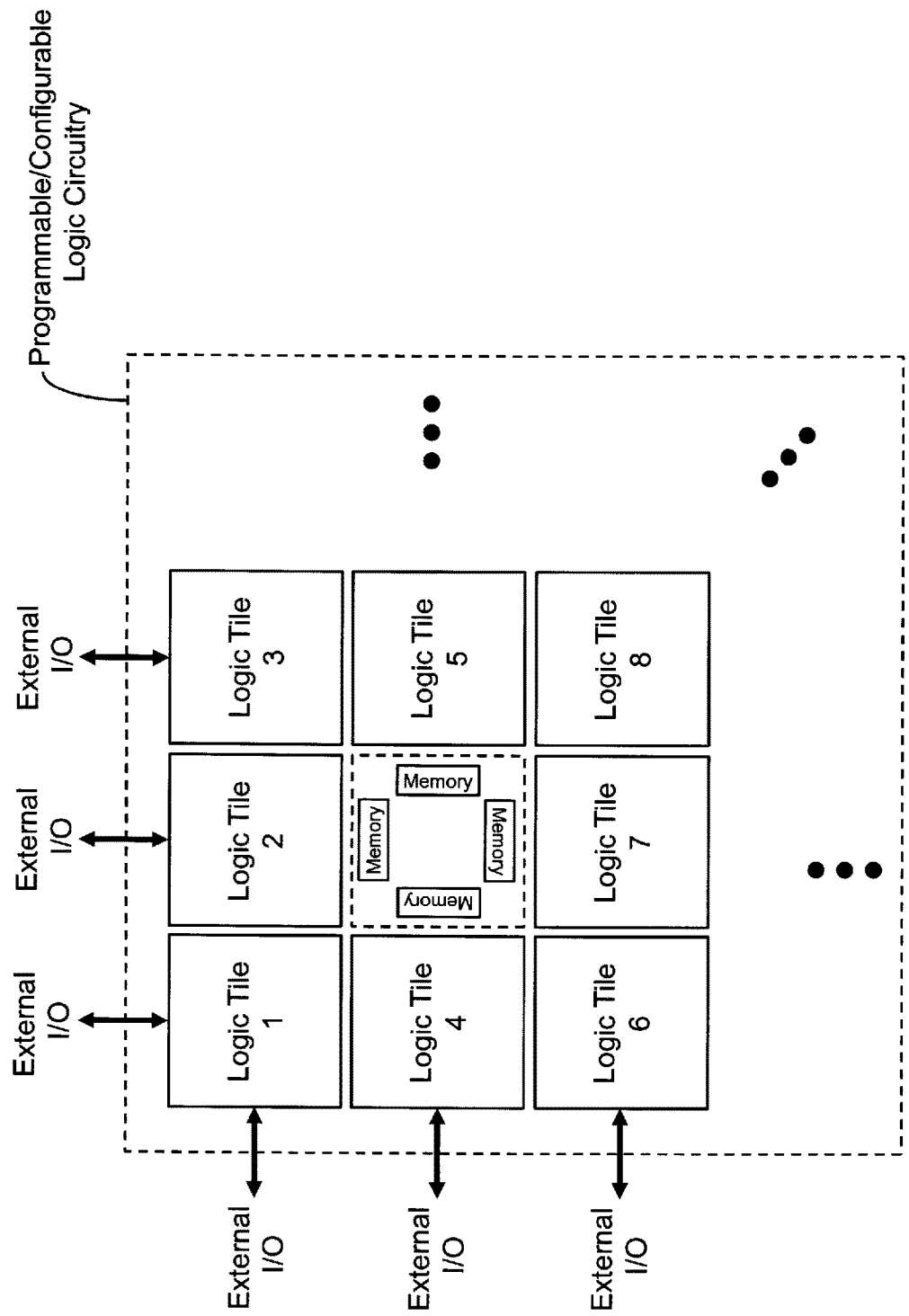

Notably, the memory may be dispersed within the perimeter of the of the programmable/configurable logic circuitry (and adjacent to logic tiles associated therewith) (see, for example, FIGS. 2A-2C and 3A-3H) or located in a specific location, for example, a center relative to the all of the logic tiles of the programmable/configurable logic circuitry (see, for example, FIGS. 12A and 12B) or a subset of the logic tiles of the programmable/configurable logic circuitry (see, for example, FIG. 12C).

Figure 13:
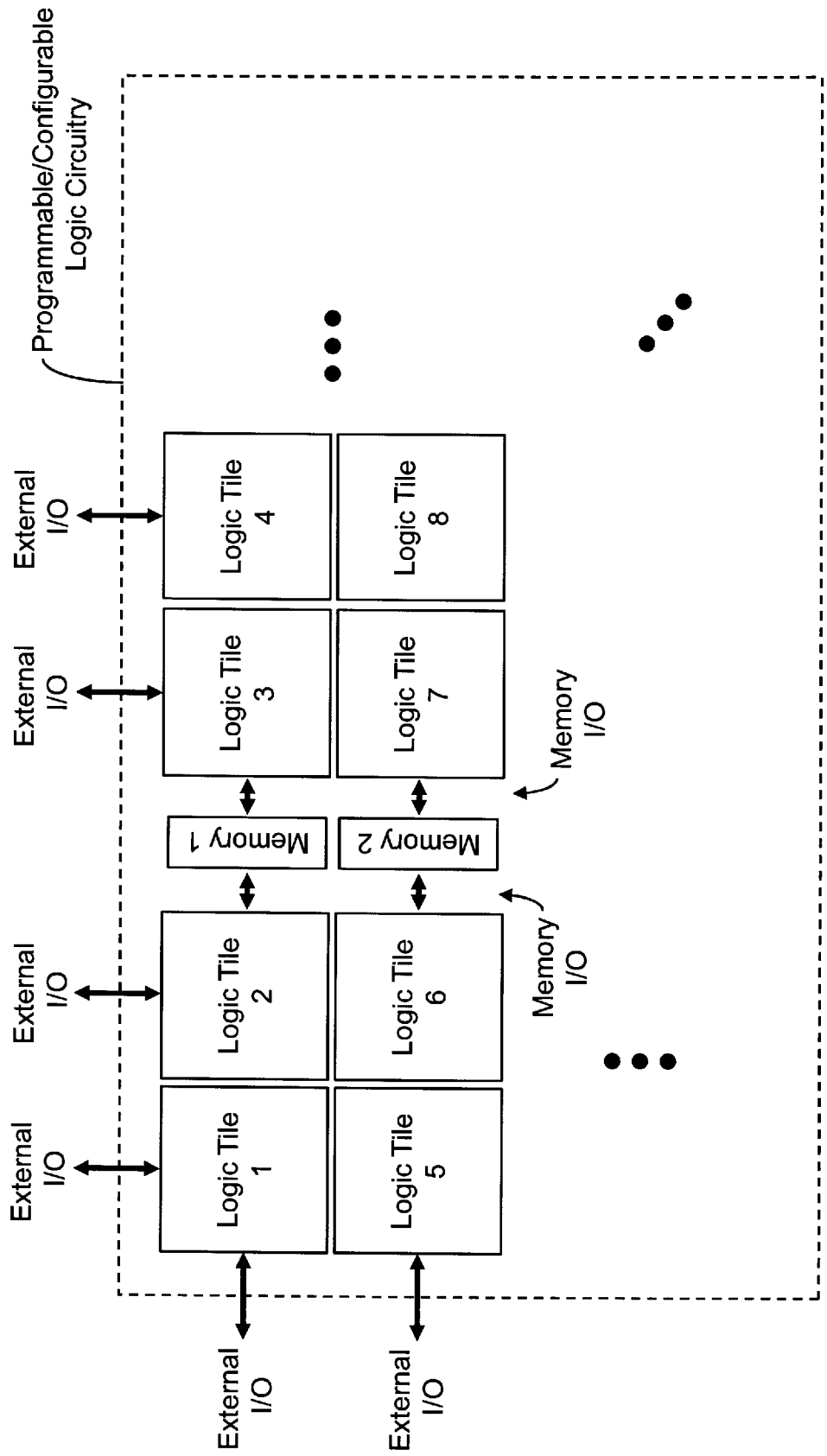
FIGS. 13 and 14 illustrate exemplary block diagram representations of exemplary programmable/configurable logic circuitry which includes a plurality of logic tiles and a plurality of blocks or arrays of memory, according to certain aspects of the present inventions wherein, each block or array of memory (dynamic or static random access memory) is electrically coupled to and operatively associated with two or more logic tiles wherein one or more such logic tiles is/are not an adjacent logic tile; all combinations of adjacent and/or non-adjacent memory—logic tile configurations/architectures are intended to fall within the scope of the present inventions; notably, in one embodiment of the present inventions, the block or array of memory may be electrically coupled to the logic circuitry or blocks of the logic tile associated with the memory via predetermined I/O of such logic tile (for example, I/O pins and I/O circuitry or blocks that are not employed to interconnect circuitry of the logic tile and circuitry external to the programmable/configurable logic circuitry—i.e., unused I/O circuitry or blocks of the logic tile); in another embodiment according to certain aspects of the present inventions, non-adjacent memory blocks are interconnected with the memory via the interconnect network which facilitates tile-to-tile communication.
Figure 14:
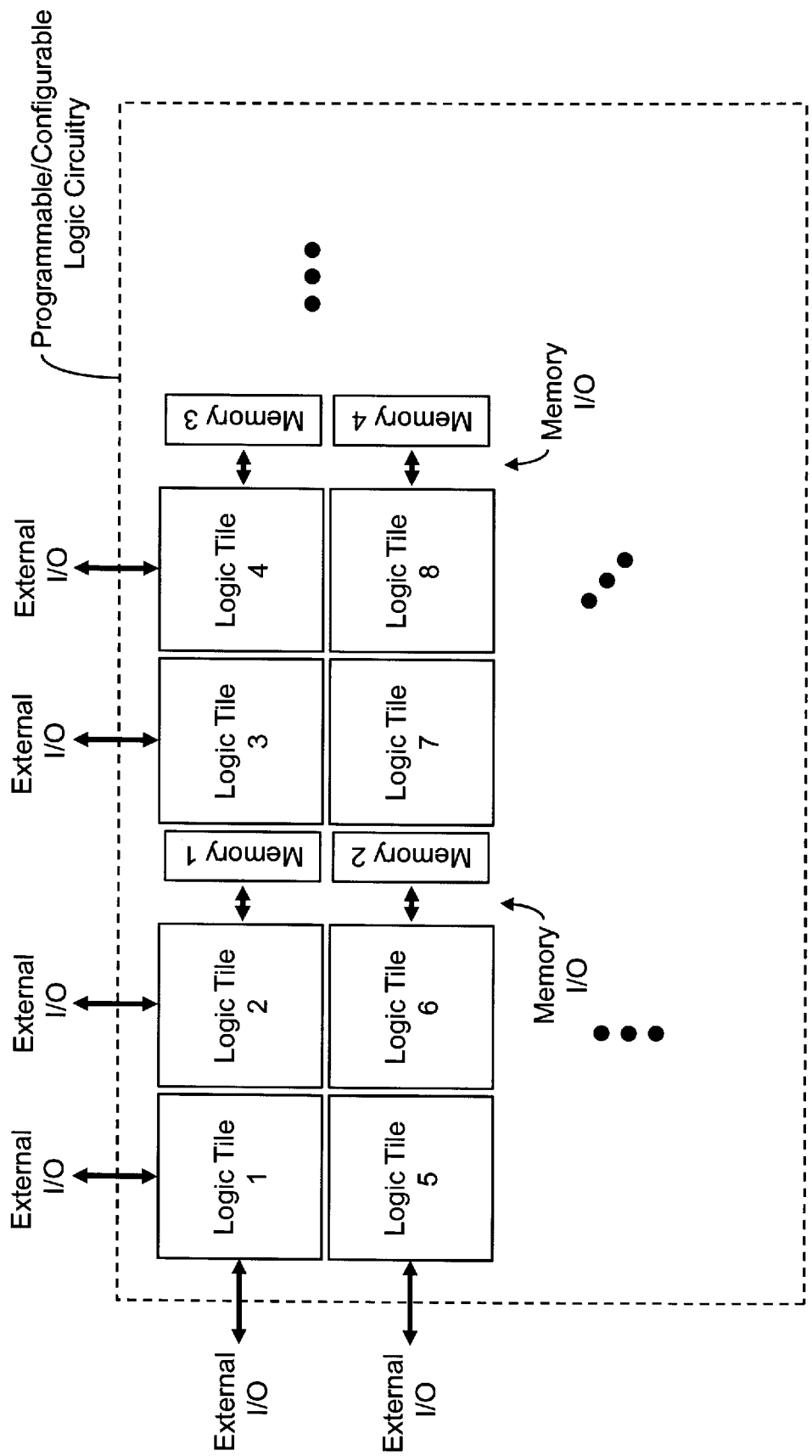

Although in many of the embodiments, the memory interfaces/communicates with logic tiles that are adjacent thereto. In other embodiments, the memory communicates with one or more tiles that are not adjacent thereto. For example, with reference to FIG. 13, logic tiles 1 and 5 employ memory 1 and 2, respectively, in operation as, for example, a scratchpad memory, a first-in-first-out (FIFO) memory, and/or a data/instruction RAM. The logic tiles 1 and 5 may interconnected with memory 1 and 2, respectively, via the interconnect network with logic tiles 2 and 6, respectively, which provide tile-to-tile communication. Similarly, with reference to FIG. 14, logic tiles 3 and 7 may interconnected with memory 3 and 4, respectively, via the interconnect network with logic tiles 2 and 6.

It should be noted that, in one embodiment, unused external I/O of non-adjacent logic tiles may be employed as memory I/O to facilitate or provide direct communication with associated memory. For example, it may be advantageous to electrically connect I/O of a non-adjacent logic tile where the memory architecture employed more I/O than is available for an adjacent logic tile. Thus, with reference to FIGS. 13 and 14, in one embodiment, unused external I/O of logic tile 1 may be employed as data, address and/or control for memory 1 (wherein such unused external I/O are memory I/O of logic tile 1; as noted herein, I/O typically includes I/O pins and associated I/O circuitry or blocks).

Further, in one embodiment, it may be advantageous to route the memory interface or connections (for example, address, data and control) to the memory I/O of the associated logic tile(s) via metal layers 1 through 4. Such a routing architecture facilitates the memory (BRAM) being disposed between consecutive logic tiles and juxtaposed or adjacent to one or more associated logic tiles of the array of logic tiles of the programmable/configurable logic circuitry by implementing the tile-to-tile interconnect network connections (see, for example, U.S. patent application Ser. No. 15/041,085, filed Feb. 11, 2016, which claims priority to U.S. Provisional Application No. 62/119,215) routing to travel on metal layers 5 and 6.

Figure 15A:
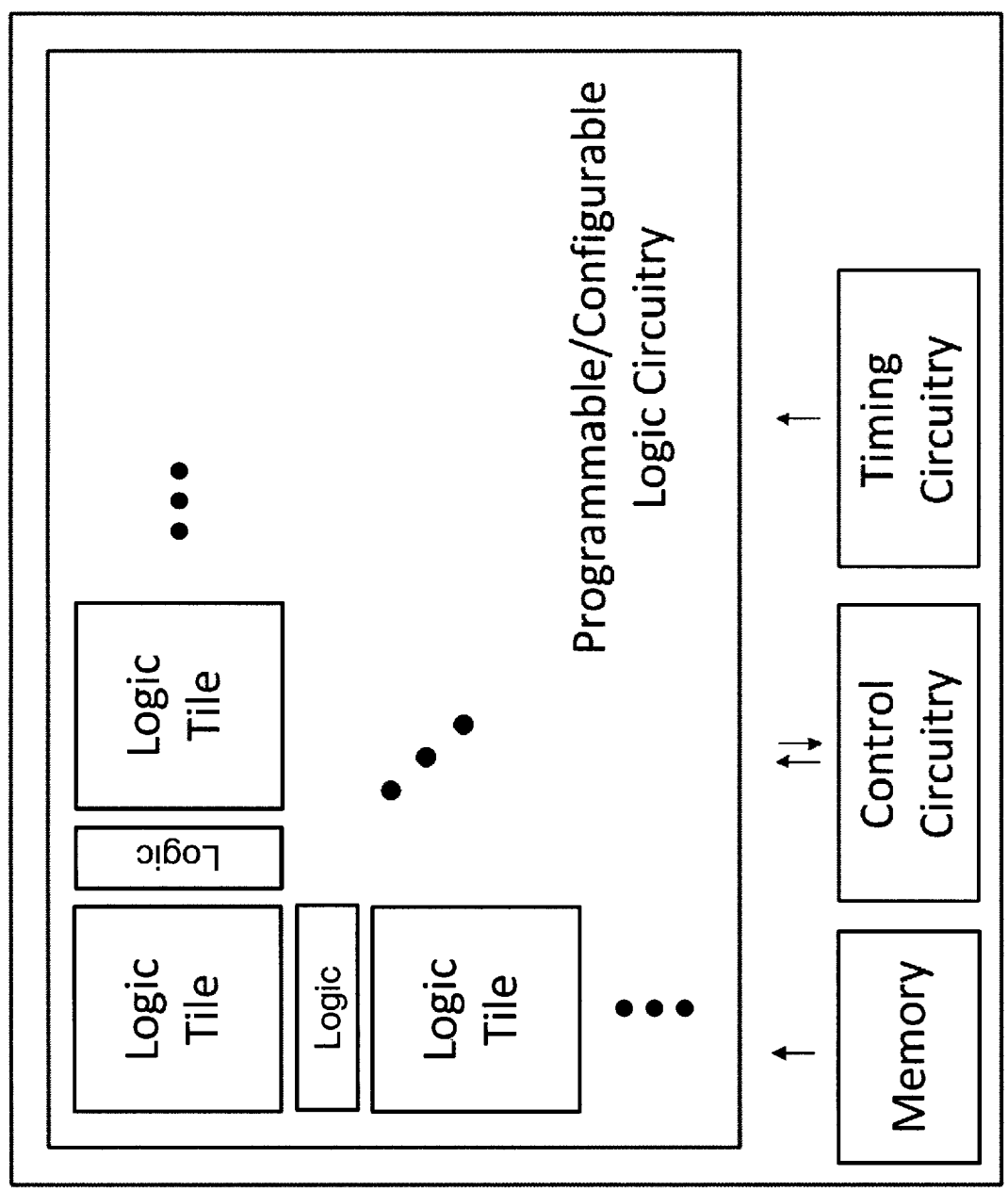
FIGS. 15A-15E illustrate exemplary block diagram representations of exemplary integrated circuit including control circuitry, clock circuitry, memory and programmable/configurable logic circuitry (which includes a plurality of logic tiles) according to certain aspects of the present inventions wherein logic is disposed between consecutive logic tiles and/or located adjacent to logic tiles of the array of logic tiles in the interior of the programmable/configurable logic circuitry according to aspects of the present inventions; the logic may be any non-memory circuitry including, for example, an accelerator, multiplier (for example, floating point and/or fixed point multiplier(s)), encryption circuitry (for example, one or more encryption/decryption engines), signal processor and/or custom logic; notably, both logic and memory disposed may be disposed between consecutive logic tiles or located adjacent to interior borders, edges or sides of logic tiles of the array of logic tiles (which is in the interior of the programmable/configurable logic circuitry) according to aspects of the present inventions (see FIGS. 15D and 15E); as discussed herein, the memory may be a block or an array of dynamic, static and/or content-addressable random access memory such as TCAM, DRAM, SRAM, Flash, EPROM, EEPROM and/or MRAM (all memory types are intended to call within the scope of the present inventions).
Figure 15B:
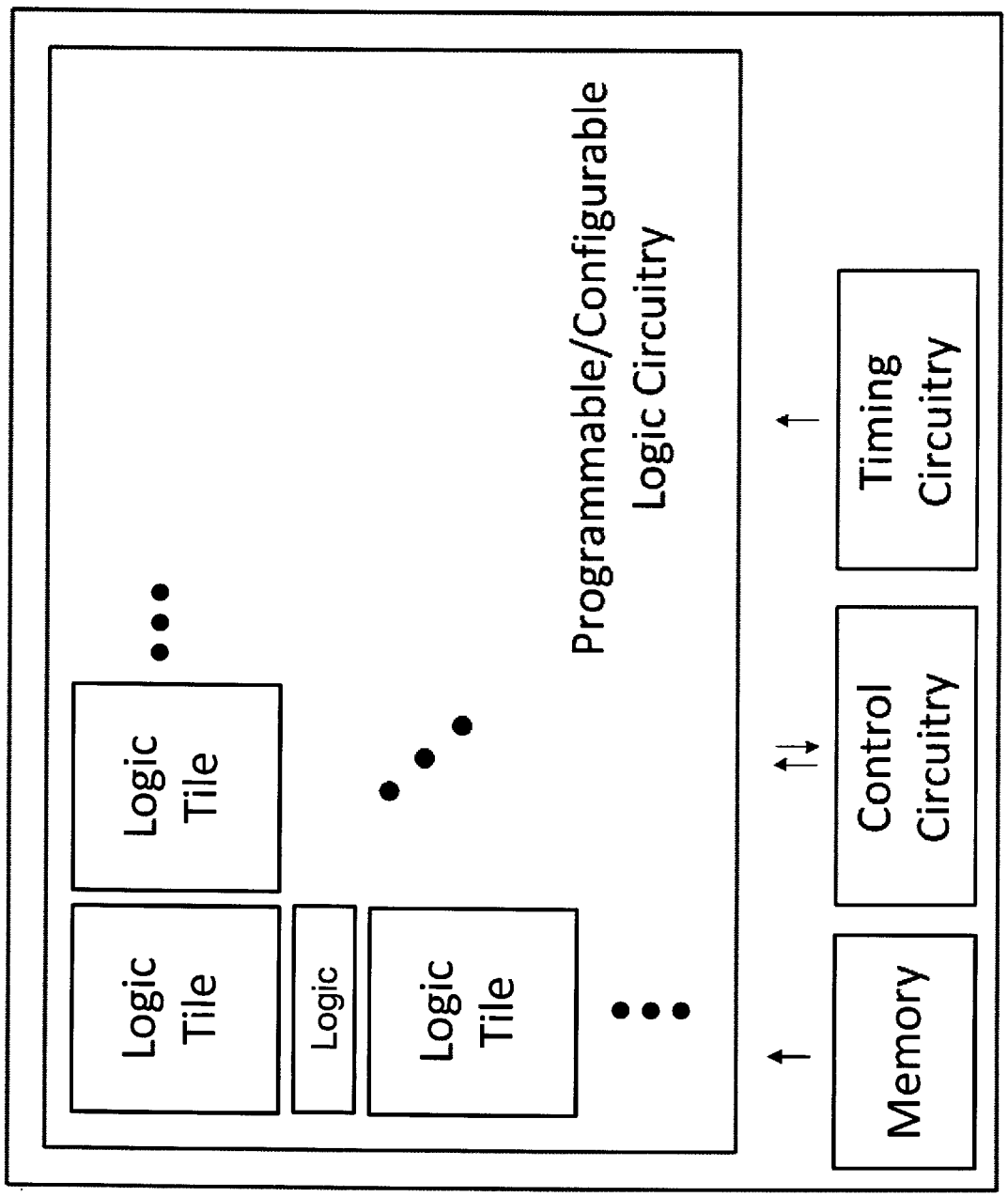
Figure 15C:
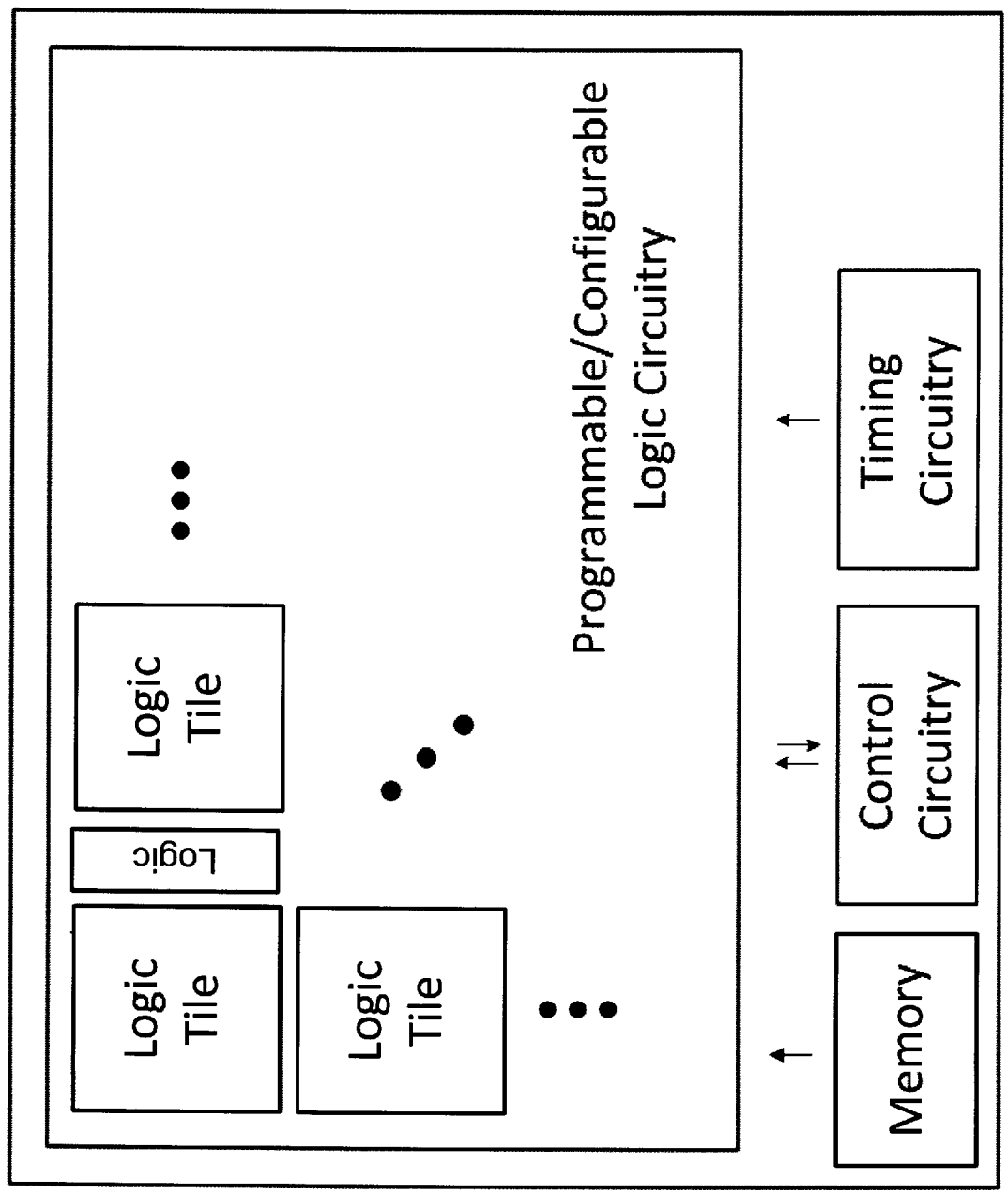
Figure 15D:
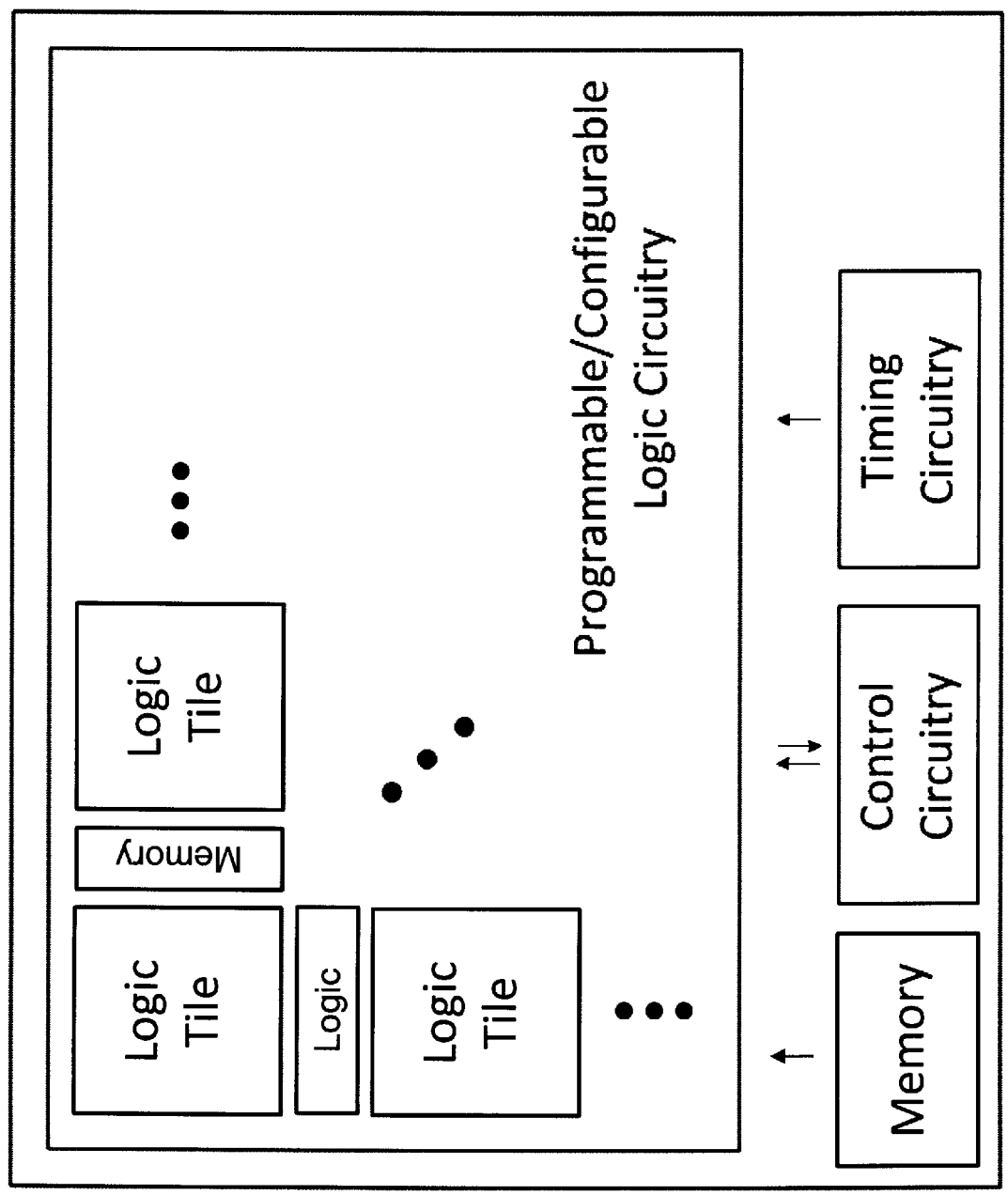
Figure 15E:
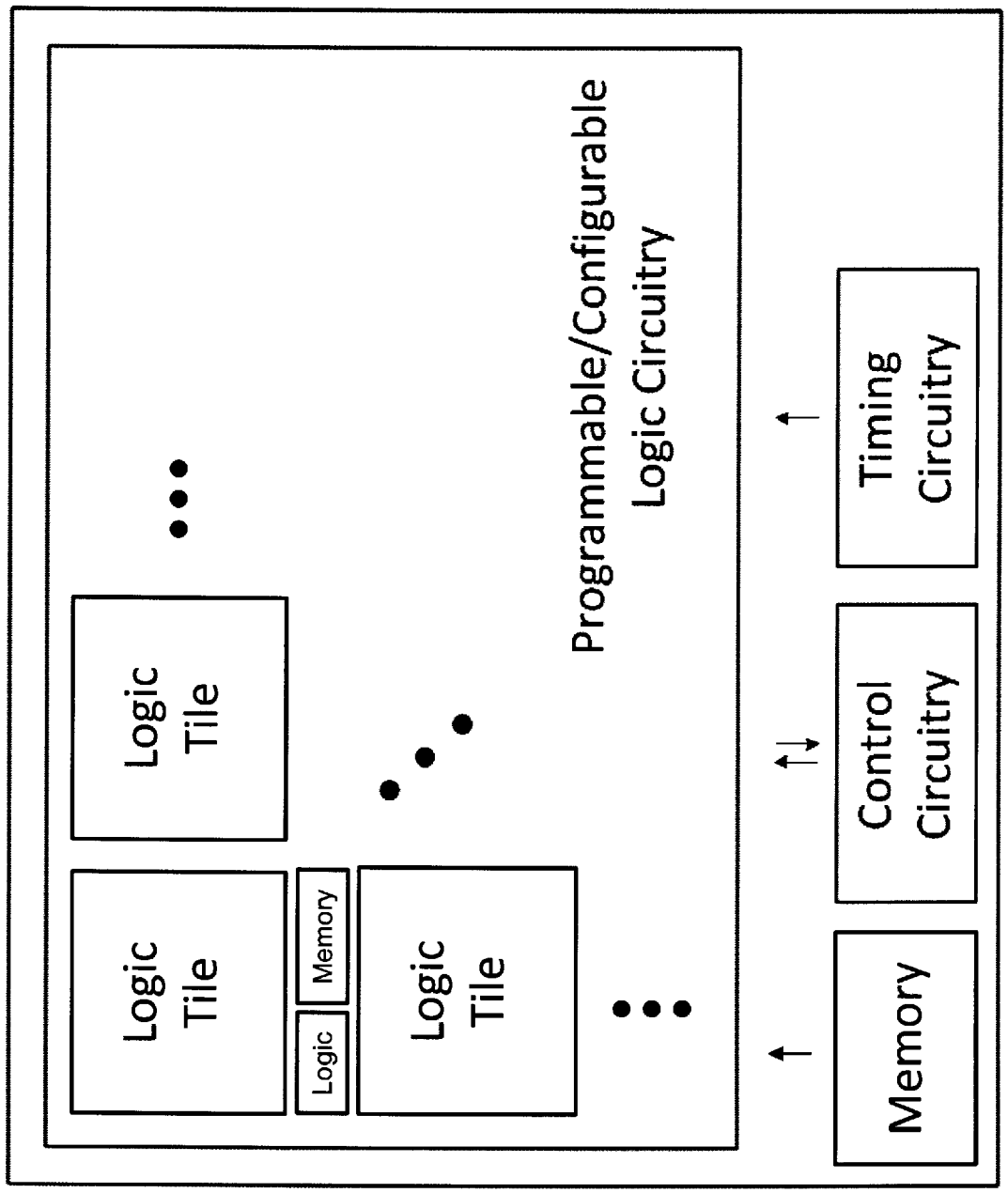

While the inventions and/or embodiments of the present inventions have been described in the context of disposing or locating memory in the interior of the programmable/configurable logic circuitry between consecutive logic tiles of the array of logic tiles, such discussion, inventions and/or embodiments are also applicable to disposing or locating logic in the interior of the programmable/configurable logic circuitry between consecutive logic tiles of the array of logic tiles. (See, FIGS. 15A-E). Here, the logic may be any non-memory circuitry including, for example, an accelerator, multiplier (for example, floating point and/or fixed point multiplier(s)), encryption circuitry (for example, one or more encryption/decryption engines), signal processor and/or custom logic that is operatively associated with one or more logic tiles of the array of logic tiles (preferably, one or more logic tiles adjacent to the logic). For the sake of brevity, a separate discussion for every programmable/configurable logic circuitry logic having logic disposed or located adjacent interior sides, edges or borders of the logic tiles of the programmable/configurable logic circuitry is not provided; however the applicability is clear to one of ordinary skill in the art based on the instant disclosure to, for example, logic disposed/located between consecutive logic tiles of the array of logic tiles of the programmable/configurable logic circuitry of an integrated circuit wherein such logic is electrically coupled to and operatively associated with one or more of the logic tiles of the array. Accordingly, all of the inventions described and illustrated herein which are set forth in the context of memory being disposed between consecutive logic tiles of the array are entirely applicable to integrated circuits having logic disposed between consecutive logic tiles and/or adjacent to one or more logic tiles of the array of logic tiles of the programmable/configurable logic circuitry of the integrated circuit. Moreover, both logic and memory may be disposed between consecutive logic tiles and/or adjacent to one or more logic tiles of the array. (See, FIGS. 15D and 15E). All combinations and/or permutations of the logic and memory disposed between consecutive logic tiles of the array and/or located adjacent to logic tiles of the array in the interior of the programmable/configurable logic circuitry are intended to fall within the scope of the inventions.

Moreover, while inventions and/or embodiments of the present inventions have been described and/or illustrated in connection with a particular memory type (for example, SRAM), such inventions and/or embodiments thereof are applicable to any memory type (for example, TCAM, DRAM, Flash and/or MRAM). For the sake of brevity, a separate discussion for every memory type is not provided; however the applicability is clear to one of ordinary skill in the art based on the instant disclosure.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Notably, various circuits, circuitry and techniques disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit, circuitry, layout and routing expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits, circuitry and techniques disclosed herein may be represented via simulations using computer aided design and/or testing tools. The simulation of the inventive circuits, circuitry, layout and routing, and/or techniques implemented thereby, may be implemented by a computer system wherein characteristics and operations of such circuits, circuitry, layout and techniques implemented thereby, are imitated, replicated and/or predicted via a computer system. The present inventions are also directed to such simulations of the inventive circuits, circuitry and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" (or the like) means that a particular feature, structure, or characteristic described in connection with the embodiment may be included, employed and/or incorporated in one, some or all of the embodiments of the present inventions. The usages or appearances of the phrase "in one embodiment" or "in another embodiment" (or the like) in the specification are not referring to the same embodiment, nor are separate or alternative embodiments necessarily mutually exclusive of one or more other embodiments, nor limited to a single exclusive embodiment. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, as noted above, an embodiment or implementation described herein as "exemplary" is not to be construed as preferred or advantageous, for example, over other embodiments or implementations; rather, it is intended convey or indicate the embodiment or embodiments are example embodiment(s).

Finally, although the present inventions have been described in certain specific aspects, many additional modifications and variations would be apparent to those skilled in the art. It is therefore to be understood that the present inventions may be practiced otherwise than specifically described without departing from the scope and spirit of the present inventions. Thus, embodiments of the present inventions should be considered in all respects as illustrative and not restrictive.

As used in the claims, the terms "comprises," "comprising," "includes," "including," "have," and "having" or any other variation thereof, are intended to cover a non-exclusive inclusion, such that a process, method, circuit, article, or apparatus that comprises a list of elements does not include only those elements but may include other elements not expressly listed or inherent to such process, method, article, or apparatus.

In the claims, and elsewhere, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. The term "data" may mean, among other things, a current or voltage signal(s) whether in analog or a digital form (which may be a single bit (or the like) or multiple bits (or the like)). Further, the term "logic tile" means a design unit or block of a plurality of transistors (typically more than thousands), which, in this application, is capable of connecting to a plurality of neighboring "tiles", "cores" or "blocks". The term "multiplexers" means multiplexers and/or switches. Moreover, as noted above, the term (i) "integrated circuit" means, among other things, a processor, controller, state machine, gate array, SOC, PGA and/or FPGA.

What is claimed is:

1. An integrated circuit comprising:
   programmable/configurable logic circuitry having a periphery, the programmable/configurable logic circuitry includes:
   a first memory array; and
   a plurality of logic tiles organized in an array, wherein each logic tile of the plurality of logic tiles includes:

an interconnect network including a plurality of multiplexers,
a plurality of interconnect I/O to connect to the interconnect network and one or more interconnect I/O of one or more other logic tiles of the plurality of logic tiles,
a perimeter,
a plurality of I/O disposed in an I/O layout on the perimeter of the logic tile, wherein:
the I/O layout of each logic tile is identical,
each I/O of the I/O layout is configurable as (i) an external I/O to connect to and communicate with circuitry external to the programmable/configurable logic circuitry, or (ii) a memory I/O to point-to-point connect to memory physically located adjacent thereto, or (iii) an unused I/O, and
circuitry configurable to read data from and write data to memory via associated memory I/O;
wherein:
the first memory array is (i) located between and adjacent to first and second logic tiles of the plurality of logic tiles on a first portion of the perimeter of each of the first and second logic tiles which is interior to the periphery of the programmable/configurable logic circuitry and (ii) point-to-point connected to the memory I/O located on the first portion of the perimeter of the first logic tile which is adjacent to the first memory array wherein the first memory array is directly connected to the memory I/O located on the first portion of the perimeter of the first logic tile,
a second portion of the perimeter of the first logic tile forms at least a portion of the periphery of the programmable/configurable logic circuitry, and
external I/O is disposed on the second portion of the perimeter of the first logic tile and is configured to connect to and communicate with circuitry external to the programmable/configurable logic circuitry; and
in operation of the programmable/configurable logic circuitry, the circuitry of the first logic tile is configured to:
apply address and control signals to the first memory array, via the memory I/O located on the first portion of the perimeter of the first logic tile, to read data from the first memory array, and
apply data, address and control signals to the first memory array, via the memory I/O located on the first portion of the perimeter of the first logic tile, to write data to the first memory array.

2. The integrated circuit of claim 1 wherein:
the first memory array is point-to-point connected to the memory I/O located on the first portion of the perimeter of the second logic tile which is adjacent to the first memory array, wherein the first memory array is directly connected to the memory I/O located on the first portion of the perimeter of the second logic tile; and
in operation of the programmable/configurable logic circuitry, the circuitry of the second logic tile is configured to:
apply address and control signals to the first memory array, via the memory I/O located on the first portion of the perimeter of the second logic tile, to read data from the first memory array into the second logic tile via the memory I/O located on the first portion of the perimeter of the second logic tile, and
apply data, address and control signals to the first memory array, via the memory I/O located on the first portion of the perimeter of the second logic tile, to write data to the first memory array.

3. The integrated circuit of claim 1 wherein the first memory array is SRAM, DRAM or MRAM.

4. The integrated circuit of claim 3 wherein the first memory array includes parity or ECC circuitry.

5. The integrated circuit of claim 3 wherein the first memory array is a dual port memory.

6. The integrated circuit of claim 1 wherein the plurality of logic tiles are configured in an array having a plurality of rows and a plurality of columns of logic tiles.

7. An integrated circuit comprising:
programmable/configurable logic circuitry having a periphery, the programmable/configurable logic circuitry includes:
a first memory array; and
a plurality of logic tiles, wherein each logic tile of the plurality of logic tiles includes:
an interconnect network including a plurality of multiplexers,
a plurality of interconnect I/O to connect to the interconnect network and one or more interconnect I/O of one or more other logic tiles of the plurality of logic tiles,
a perimeter,
a plurality of I/O disposed in an I/O layout on the perimeter of the logic tile, wherein:
the I/O layout of each logic tile is identical,
each I/O of the I/O layout is configurable as (i) an external I/O to connect to and communicate with circuitry external to the programmable/configurable logic circuitry, or (ii) a memory I/O to point-to-point connect to memory physically located adjacent thereto, or (iii) an unused I/O, and
circuitry configurable to read data from and write data to memory via associated memory I/O;
wherein:
the first memory array is (i) physically adjacent to a first logic tile of the plurality of logic tiles on a first portion of the perimeter of the first logic tile which is interior to the periphery of the programmable/configurable logic circuitry and (ii) point-to-point connected to the memory I/O located on the first portion of the perimeter of the first logic tile which is adjacent to the first memory array wherein the first memory array is directly connected to the memory I/O located on the first portion of the perimeter of the first logic tile which is adjacent to the first memory array,
a second portion of the perimeter of the first logic tile forms a first portion of the periphery of the programmable/configurable logic circuitry, and
external I/O is disposed on the second portion of the perimeter of the first logic tile and is configured to connect to and communicate with circuitry external to the programmable/configurable logic circuitry; and
in operation of the programmable/configurable logic circuitry, the circuitry of the first logic tile is configured to:
apply address and control signals to the first memory array, via the memory I/O located on the first portion of the perimeter of the first logic tile, to read data from the first memory array into the first logic tile via the memory I/O located on the first portion of the perimeter of the first logic tile, and apply data, address and control signals to the first memory array, via the memory I/O located on the first portion of the perimeter of the first logic tile, to write data to the first memory array.

8. The integrated circuit of claim 7 wherein:
a third portion of the perimeter of the first logic tile forms a second portion of the periphery of the programmable/configurable logic circuitry, and
external I/O is disposed on the third portion of the perimeter of the first logic tile and is configured to connect to and communicate with circuitry external to the programmable/configurable logic circuitry.

9. The integrated circuit of claim 7 wherein:
programmable/configurable logic circuitry further includes a second memory array,
the second memory array is (i) physically adjacent to the first logic tile of the plurality of logic tiles on a second portion of the perimeter of the first logic tile which is interior to the periphery of the programmable/configurable logic circuitry and (ii) point-to-point connected to the memory I/O located on the second portion of the perimeter of the first logic tile which is adjacent to the second memory array wherein the second memory array is directly connected to the memory I/O located on the second portion of the perimeter of the first logic tile which is adjacent to the second memory array, and
in operation of the programmable/configurable logic circuitry, the circuitry of the first logic tile is configured to:
apply address and control signals to the second memory array, via the memory I/O located on the second portion of the perimeter of the first logic tile, to read data from the second memory array, and
apply data, address and control signals to the second memory array, via the memory I/O located on the second portion of the perimeter of the first logic tile, to write data to the second memory array.

10. The integrated circuit of claim 9 wherein:
a third portion of the perimeter of the first logic tile forms a first portion of the periphery of the programmable/configurable logic circuitry, and
external I/O is disposed on the third portion of the perimeter of the first logic tile and is configured to connect to and communicate with circuitry external to the programmable/configurable logic circuitry.

11. The integrated circuit of claim 7 wherein the first memory array is SRAM, DRAM or MRAM.

12. The integrated circuit of claim 11 wherein the first memory array includes parity or ECC circuitry.

13. The integrated circuit of claim 11 wherein the first memory array is a dual port memory.

14. An integrated circuit comprising:
programmable/configurable logic circuitry having a periphery, the programmable/configurable logic circuitry includes:
a first memory array; and
a plurality of logic tiles, wherein each logic tile of the plurality of logic tiles includes:
an interconnect network including a plurality of multiplexers,
a plurality of interconnect I/O to connect to the interconnect network and one or more interconnect I/O of one or more other logic tiles of the plurality of logic tiles,
a perimeter,
a plurality of I/O disposed in an I/O layout on the perimeter of the logic tile, wherein:
the I/O layout of each logic tile is identical,
each I/O of the I/O layout is configurable as (i) an external I/O to connect to and communicate with circuitry external to the programmable/configurable logic circuitry, or (ii) a memory I/O to point-to-point connect to memory physically located adjacent thereto, or (iii) an unused I/O, and
circuitry configurable to read data from and write data to memory via associated memory I/O;
wherein:
the first memory array is (i) physically adjacent to a first logic tile of the plurality of logic tiles on a first portion of the perimeter of the first logic tile which is interior to the periphery of the programmable/configurable logic circuitry and (ii) point-to-point connected to the memory I/O located on the first portion of the perimeter of the first logic tile which is adjacent to the first memory array wherein the first memory array is directly connected to the memory I/O located on the first portion of the perimeter of the first logic tile which is adjacent to the first memory array, and
the programmable/configurable logic circuitry further includes a second memory array, wherein:
the second memory array is (i) physically adjacent to the first logic tile of the plurality of logic tiles on a second portion of the perimeter of the first logic tile which is interior to the periphery of the programmable/configurable logic circuitry and (ii) point-to-point connected to the memory I/O located on the second portion of the perimeter of the first logic tile which is adjacent to the second memory array wherein the second memory array is directly connected to the memory I/O located on the second portion of the perimeter of the first logic tile which is adjacent to the second memory array, and
a third portion of the perimeter of the first logic tile forms a first portion of the periphery of the programmable/configurable logic circuitry, and
external I/O is disposed on the third portion of the perimeter of the first logic tile and is configured to connect to and communicate with circuitry external to the programmable/configurable logic circuitry; and
in operation of the programmable/configurable logic circuitry, the circuitry of the first logic tile is configured to:
apply address and control signals to the first memory array, via the memory I/O located on the first portion of the perimeter of the first logic tile, to read data from the first memory array into the first logic tile via the memory I/O located on the first portion of the perimeter of the first logic tile, and
apply data, address and control signals to the first memory array, via the memory I/O located on the first portion of the perimeter of the first logic tile, to write data to the first memory array, and
apply address and control signals to the second memory array, via the memory I/O located on the second portion of the perimeter of the first logic tile, to read data from the second memory array, and
apply data, address and control signals to the second memory array, via the memory I/O located on the second portion of the perimeter of the first logic tile, to write data to the second memory array.

15. The integrated circuit of claim 14 wherein the first memory array is SRAM, DRAM or MRAM.

16. The integrated circuit of claim 15 wherein the first memory array includes parity or ECC circuitry.

17. The integrated circuit of claim 15 wherein the first memory array is a dual port memory.

* * * * *